US008735951B2

United States Patent
Lim et al.

(10) Patent No.: US 8,735,951 B2
(45) Date of Patent: May 27, 2014

(54) SEMICONDUCTOR DEVICE HAVING DIFFUSION BARRIER ELEMENT INJECTION REGION

(75) Inventors: Hajin Lim, Seoul (KR); Moonhan Park, Yongin-si (KR); Jinho Do, Yongin-si (KR); Moonkyun Song, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 74 days.

(21) Appl. No.: 13/327,960

(22) Filed: Dec. 16, 2011

(65) Prior Publication Data
US 2012/0161211 A1 Jun. 28, 2012

(30) Foreign Application Priority Data

Dec. 23, 2010 (KR) .................. 10-2010-0133494

(51) Int. Cl.
*H01L 29/78* (2006.01)

(52) U.S. Cl.
USPC ............ 257/288; 257/250; 257/E29.255; 257/E29.152

(58) Field of Classification Search
USPC .......... 257/288, E29.255, 900, E29.152, 250
See application file for complete search history.

(56) References Cited

U.S. PATENT DOCUMENTS

| | | | |
|---|---|---|---|
| 6,797,555 B1 | 9/2004 | Hopper et al. | |
| 7,157,357 B2 | 1/2007 | Kim | |
| 2003/0001219 A1* | 1/2003 | Chau et al. | 257/412 |
| 2003/0052348 A1* | 3/2003 | Takagi et al. | 257/288 |
| 2009/0283842 A1* | 11/2009 | Hokazono | 257/392 |
| 2011/0147838 A1* | 6/2011 | Gossner et al. | 257/345 |

FOREIGN PATENT DOCUMENTS

| | | |
|---|---|---|
| KR | 10-1996-0011638 B1 | 8/1996 |
| KR | 10-2005-0066900 A | 6/2005 |
| KR | 10-2005-0071906 A | 7/2005 |

OTHER PUBLICATIONS

Anomalous Narrow Width Effect in NMOS and PMOS Surface Channel Transistors Using Shallow Trench Isolation, Lau et al., © 2005.

* cited by examiner

*Primary Examiner* — Mamadou Diallo
(74) *Attorney, Agent, or Firm* — Lee & Morse, P.C.

(57) ABSTRACT

A semiconductor device includes an isolation pattern disposed on a substrate, the isolation pattern defining an active part, a gate pattern crossing the active part on the substrate, the gate pattern including a dielectric pattern and a first conductive pattern, and the dielectric pattern being between the active part and the first conductive pattern, a pair of doping regions in the active part adjacent to side walls of the gate pattern, the gate pattern being between the pair of doping regions, and a diffusion barrier element injection region disposed in an upper region of the active part.

19 Claims, 19 Drawing Sheets

SEMICONDUCTOR DEVICE HAVING DIFFUSION BARRIER ELEMENT INJECTION REGION

CROSS-REFERENCE TO RELATED APPLICATIONS

Korean Patent Application No. 10-2010-0133494, filed on Dec. 23, 2010, in the Korean Intellectual Property Office, and entitled: "Semiconductor Device," is incorporated by reference herein in its entirety.

BACKGROUND

1. Field

The present inventive concept herein relates to a semiconductor device, and more particularly, to a semiconductor device including a diffusion barrier element injection region.

2. Description of the Related Art

In electronic industries related to portable phones and notebook computers, demands for the lightening, miniaturizing, speeding-up, multi-function, high performance, high reliability, and low cost of products are recently increasing. To satisfy such demands, it is particularly required to increase a degree of integration of semiconductor devices and secure the process margins of the semiconductor devices. In particular, various researches are being conducted for increasing a degree of integration and improving reliability and electric characteristic.

SUMMARY

The present inventive concept provides a semiconductor device with enhanced reliability and electric characteristic.

Embodiments of the inventive concept may provide a semiconductor device, including an isolation pattern disposed on a substrate, the isolation pattern defining an active part, a gate pattern crossing the active part on the substrate, the gate pattern including a dielectric pattern and a first conductive pattern, and the dielectric pattern being between the active part and the first conductive pattern, a pair of doping regions in the active part adjacent to side walls of the gate pattern, the gate pattern being between the pair of doping regions, and a diffusion barrier element injection region disposed in an upper region of the active part.

The active part may include a first conductive dopant, the doping regions may include a second conductive dopant, and the diffusion barrier element injection region may include a diffusion barrier element, the diffusion barrier element being configured to decrease diffusion distances of at least one of the first and second conductive dopants.

The diffusion barrier element may be a halogen.

The diffusion barrier element injection region may include first sub regions in upper regions of the doping regions, and a second sub region disposed in an upper region of the active part between the doping regions, the second sub region being between the first sub regions.

A concentration of a diffusion barrier element in each first sub region may be substantially the same as a concentration of a diffusion barrier element in the second sub region.

A concentration of a diffusion barrier element in each first sub region may be substantially lower than a concentration of a diffusion barrier element in the second sub region.

The dielectric pattern of the gate pattern may include a high dielectric material, the first conductive pattern of the gate pattern includes a conductive metal or a conductive metal nitride, an uppermost surface of the dielectric pattern being at a same level or lower than a lowermost surface of the first conductive pattern, and the gate pattern may further include a second conductive pattern including a semiconductor material, a first metal-semiconductor compound on the second conductive pattern, and a second metal-semiconductor compound disposed at an upper region of each of the doping regions, the first and second metal-semiconductor compounds including a same metal.

The diffusion barrier element injection region may be only in an upper region of each of the doping regions.

The semiconductor device may further include an epitaxial layer between the diffusion barrier element injection region and the gate pattern, the epitaxial layer having an energy band gap smaller than the active part.

A concentration of a diffusion barrier element in a portion of the diffusion barrier element injection region overlapping the doping regions may be different from a concentration of a diffusion barrier element in a portion of the diffusion barrier element injection region overlapping a channel region below the gate pattern.

The concentration of the diffusion barrier element in a portion of the diffusion barrier element injection region overlapping the doping regions may be lower than the concentration of the diffusion barrier element in a portion of the diffusion barrier element injection region overlapping the channel region.

Embodiments of the inventive concept also provide a semiconductor device, including an isolation pattern disposed on a substrate, the isolation pattern defining an active part including a semiconductor material, a gate pattern crossing the active part on the substrate, an epitaxial layer between the active part and the gate pattern, the epitaxial layer including a semiconductor material having an energy band gap smaller than the semiconductor material of the active part, a pair of doping regions in the active part adjacent to side walls of the gate pattern, the gate pattern being between the pair of doping regions, and a diffusion barrier element injection region disposed in an upper region of the active part.

The epitaxial layer may extend laterally beyond the side walls of the gate pattern.

The diffusion barrier element injection region may include a diffusion barrier element, the diffusion barrier element being a halogen.

The epitaxial layer and the diffusion barrier element injection region may include a same diffusion barrier element.

The diffusion barrier element injection region may include a pair of first sub regions disposed in the doping regions, and a second sub region disposed in an upper region of the active part between the doping regions, a concentration of a diffusion barrier element in each first sub region being lower than a concentration of a diffusion barrier element in the second sub region.

The gate pattern may include a dielectric pattern including a high dielectric material, a first conductive pattern including a conductive metal or a conductive metal nitride, an entire top of the dielectric pattern overlapping the first conductive pattern, and a second conductive pattern including a semiconductor material.

The diffusion barrier element injection region may be provided as one pair, each of the diffusion barrier element injection regions being in an upper region of each of the doping regions.

Embodiments of the inventive concept may also provide a semiconductor device, including an active part on a substrate, a gate pattern crossing the active part on the substrate, the gate pattern being between two doping regions, an epitaxial layer between the active part and the gate pattern, the epitaxial layer having a smaller energy band gap than the active part, and a diffusion barrier element injection region in an upper region of the active part, the diffusion barrier element injection region including first regions in the doping regions and a second region between the doping regions, and a concentration of a diffusion barrier element in each first region being lower than the concentration of a diffusion barrier element in the second region.

Each first region may be in an upper part of a respective doping region, the first region extending from a respective side wall of the gate pattern to overlap the respective doping region, and the second region is in the channel region of the gate pattern.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
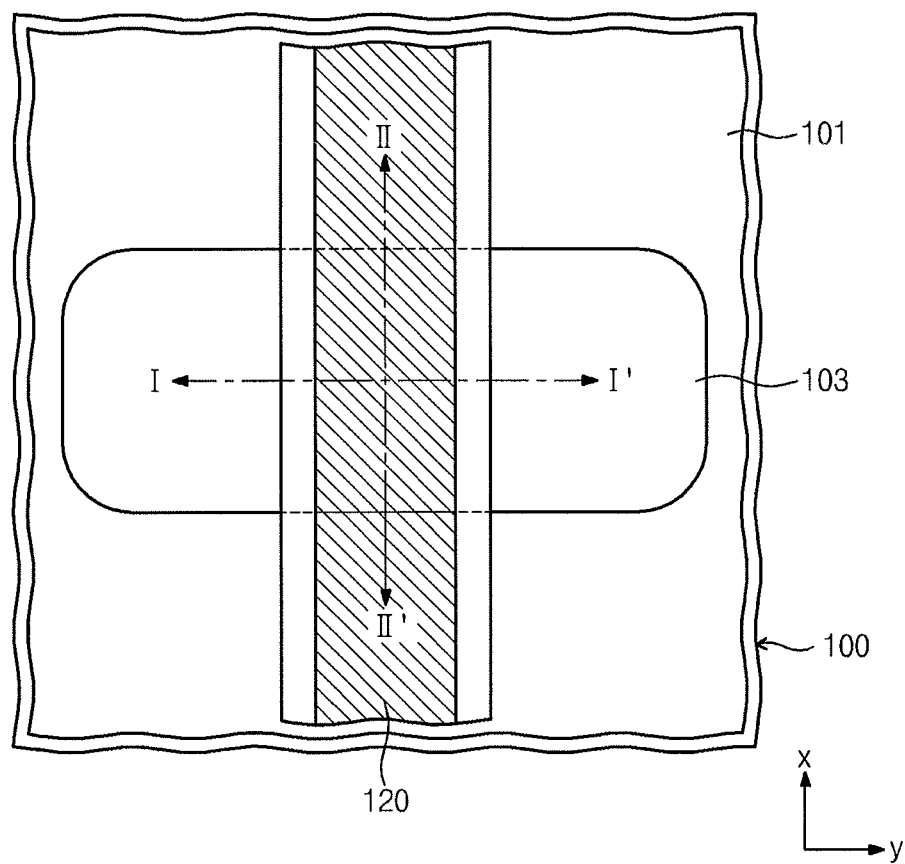
FIG. 1 illustrates a plan view of a semiconductor device according to embodiments of the inventive concept.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element, e.g., a layer, a film, or a region, is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

In the following description, the technical terms are used only for explaining a specific exemplary embodiment while not limiting example embodiments. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

The embodiment in the detailed description will be described with respect to cross-sectional views representing ideal exemplary views of example embodiments. Accordingly, shapes of the exemplary views may be modified according to manufacturing techniques and/or allowable errors. The example embodiments are not limited to the specific shape illustrated in the exemplary views, but may include other shapes that may be created according to manufacturing processes. For example, an etching region illustrated as a right angle may have a shape that is rounded or curved. Therefore, areas exemplified in the drawings have general properties, and are used to illustrate a specific shape of a semiconductor package region. Thus, this should not be construed as limited to the scope of the example embodiments.

Though terms like first, second, and third are used to describe various regions and layers in various example embodiments, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof.

First Embodiment

Figure 2A:
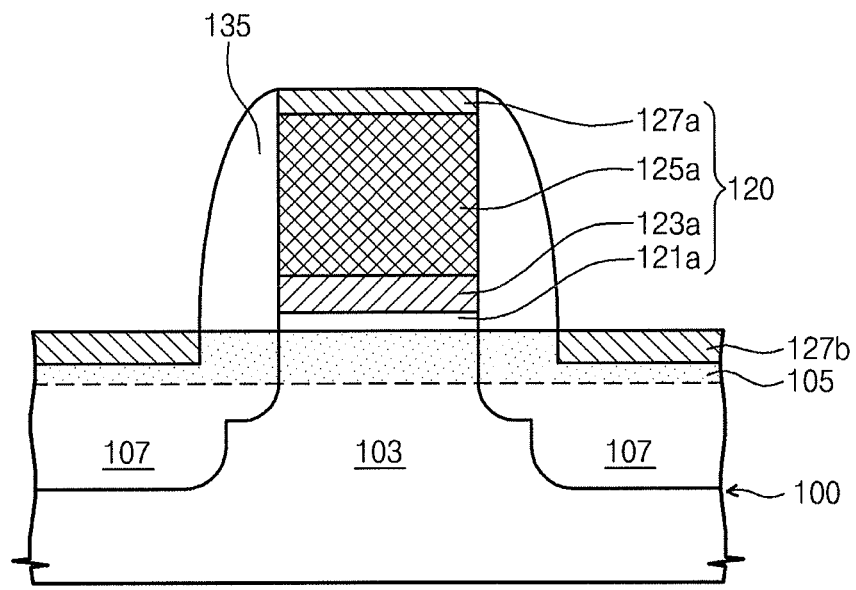
FIG. 2A illustrates a cross-sectional view taken along line I-I' of FIG. 1.

Hereinafter, a semiconductor device according to a first embodiment of the inventive concept will be described. FIG. 1 is a plan view illustrating a semiconductor device according to embodiments of the inventive concept. FIG. 2A is a sectional view taken along line I-I' of FIG. 1 and FIG. 2B is a sectional view taken along line II-II' of FIG. 1 for describing a semiconductor device according to a first embodiment of the inventive concept.

Figure 2B:
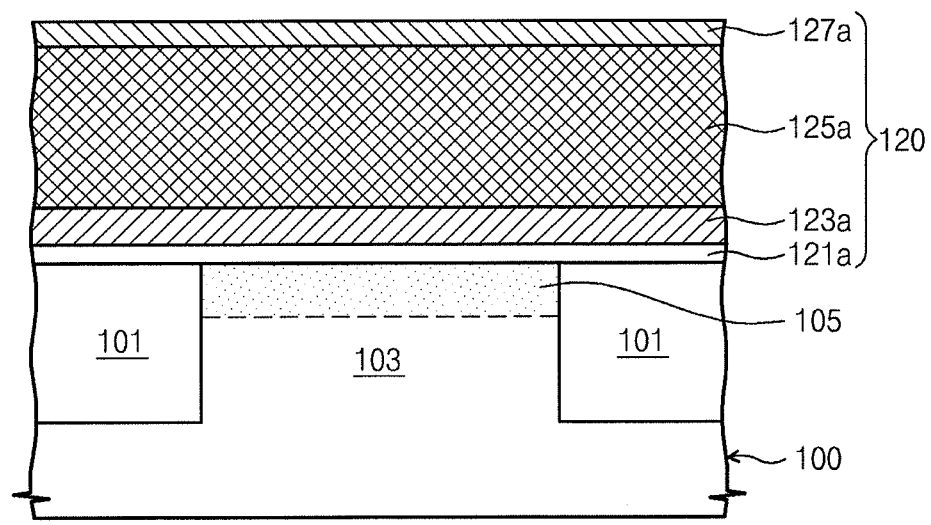
FIG. 2B illustrates a cross-sectional view taken along line II-II' of FIG. 1.

Referring to FIGS. 1, 2A, and 2B, an isolation pattern 101 defining an active part 103 may be disposed in a substrate 100. The substrate 100 may include a semiconductor material. For example, the substrate 100 may include at least one of silicon and germanium. The isolation pattern 101 may be a Shallow Trench Isolation (STI) layer, but it is not limited thereto. The isolation pattern 101 may include an insulating material. For example, the isolation pattern 101 may include at least one of oxide, nitride, and oxynitride.

The active part 103 may be a portion of the substrate 100. The active part 103 may have side walls that are extended in a first direction, e.g., along the y-axis. According to an embodiment of the inventive concept, the active part 103 may have an island shape that is surrounded by the isolation pattern 101. The active part 103 may be doped with a first conductive dopant.

A gate pattern 120 that is extended in a second direction across the active part 103, e.g., along the x-axis, may be disposed on the substrate 100. The gate pattern 120 may include a dielectric pattern 121a, a first conductive pattern 123a, a second conductive pattern 125a, and a first metal-semiconductor compound pattern 127a.

The dielectric pattern 121a may include a high dielectric material. According to an embodiment of the inventive concept, the high dielectric material may have a dielectric constant higher than that of silicon oxide, e.g., a dielectric material including metal. For example, the high dielectric material may include at least one of metal oxide (for example, hafnium oxide, aluminum oxide, or the like), a metal-semiconductor-oxygen compound (for example, a hafnium-silicon-oxygen compound, or the like), and a metal-semiconductor-oxygen-nitrogen compound (for example, a hafnium-silicon-oxygen-nitrogen compound, or the like).

The first conductive pattern 123a may include a conductive metal or a conductive metal nitride. For example, the first conductive pattern 123a may include at least one of titanium nitride or tantalum nitride. The second conductive pattern 125a may include a semiconductor material. For example, the second conductive pattern 125a may include polycrystalline silicon.

The first metal-semiconductor compound pattern 127a may include a metal-semiconductor compound. According to an embodiment of the inventive concept, a semiconductor material included in the metal-semiconductor compound may be the same material as the semiconductor material included in the second conductive pattern 125a. For example, when the second conductive pattern 125a includes polycrystalline silicon, the metal-semiconductor compound of the first metal-semiconductor compound pattern 127a may also include polycrystalline silicon, e.g., the first metal-semiconductor compound pattern 127a may be a metal silicide compound.

According to an embodiment of the inventive concept, an entire uppermost surface of the dielectric pattern 121a may overlap with the first conductive pattern 123a. The uppermost surface of the dielectric pattern 121a may be positioned at the same level as or lower than that of a lowermost surface of the first conductive pattern 123a, e.g., the dielectric pattern 121a may be between the first conductive pattern 123a and the active part 103. For example, the lowermost surface of the first conductive pattern 123a may be positioned on, e.g., directly on, the uppermost surface of the dielectric pattern 121a. According to an embodiment of the inventive concept, the dielectric pattern 121a may include a pair of side walls that are aligned with, e.g., are coextensive with, side walls of the first conductive pattern 123a.

A pair of doping regions 107 that are separated from each other may be disposed in the active part 103 adjacent to side walls of the gate pattern 120. The active part 103 between the pair of doping regions 107 may be defined as a channel region. The doping regions 107 may have a predetermined depth from a top of the active part 103. The doping regions 107 may be doped with a second conductive dopant. The second conductive dopant may be a type opposite to that of the first conductive dopant. According to an embodiment of the inventive concept, one of the first and second conductive dopants may be a p-type dopant (for example, boron (B)), and the other may be an n-type dopant (for example, phosphor (P) or arsenic (As)). For example, the first conductive dopant may be a p-type dopant (for example, boron (B)) and the second conductive dopant may be n-type dopant (for example, phosphor (P)).

Figure 3A:
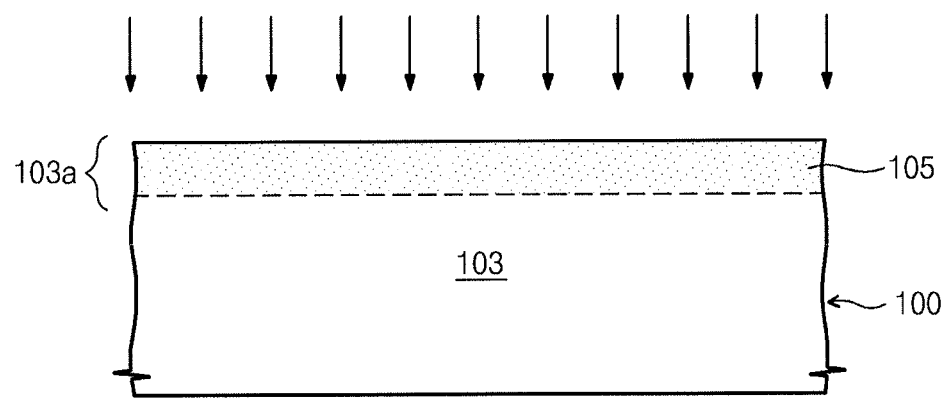
FIGS. 3A to 3E illustrate cross-sectional views of stages in a method of forming a semiconductor device according to a first embodiment of the inventive concept.

A diffusion barrier element injection region 105 may be disposed in an upper region 103a of the active part 103 (FIG. 3A). The diffusion barrier element injection region 105 may be formed by injecting a diffusion barrier element into the entire upper region of the active part 103. The diffusion barrier element may be impurities different from the first and second conductive dopants. For example, the diffusion barrier element may be a halogen, e.g., the diffusion barrier element may be fluorine.

According to an embodiment of the inventive concept, the diffusion barrier element injection region 105 may include a pair of first sub regions that are disposed in upper regions of the doping regions 107, and a second sub region that is disposed in a channel region between the doping regions 107. A concentration of the diffusion barrier element in each of the first sub regions may substantially differ from a concentration of the diffusion barrier element in the second sub region.

Diffusion barrier elements included in the second sub region of the diffusion barrier element injection region 105 may decrease the diffusion distances of the first conductive dopants that are doped in the channel region of the active part 103. Accordingly, diffusion of the first conductive dopants toward side walls of the active part 103 may be minimized.

Moreover, the first sub regions of the diffusion barrier element injection region 105 may be disposed in the doping regions 107. Diffusion barrier elements included in the first sub regions may decrease diffusion distances of the second conductive dopants included in the doping regions 107. Accordingly, depths of the doping regions 107 may be decreased, thereby facilitating control of the short channel effect of the semiconductor device according to embodiments of the inventive concept, e.g., minimize short channel effects.

A second metal-semiconductor compound pattern 127b may be disposed in upper regions of the doping regions 107. The second metal-semiconductor compound pattern 127b may be a metal-semiconductor compound. According to an embodiment of the inventive concept, a semiconductor element included in the metal-semiconductor compound of the second metal-semiconductor compound pattern 127b may be the same material as the semiconductor material included in the active part 103. For example, when the active part 103 includes silicon, the metal-semiconductor compound may be a metal silicide compound.

According to an embodiment of the inventive concept, the second metal-semiconductor compound pattern 127b and the first metal-semiconductor compound pattern 127a may include the same metal-semiconductor compound. For example, each of the first and second metal-semiconductor compound patterns 127a and 127b may include nickel silicide.

A spacer 135 covering both side walls of the gate pattern 120 may be disposed on the substrate 100. The spacer 135 may include an insulating material. For example, the spacer 135 may include at least one of oxide, nitride, and oxynitride.

According to the above-described semiconductor device, the diffusion barrier element injection region 105 including the first sub regions and the second sub region may be disposed in an upper region of the active part 103. The diffusion barrier elements included in the second sub region of the diffusion barrier element injection region 105 may decrease the diffusion distances of the first conductive dopants that are doped in the active part 103, thereby minimizing diffusion of the first conductive dopants toward first side walls of the active part 103. In contrast, a semiconductor device without the diffusion barrier element injection region 105 may include a high accumulation of the first conductive dopants in an upper region adjacent to the first side walls of the active part 103, i.e., due to increased diffusion toward the first side walls of the active part 103. Accordingly, when a width between the first side walls of the active part 103 is progressively reduced, a threshold voltage of the semiconductor device may be increased by the accumulated first conductive dopants adjacent the active part 103.

Therefore, a semiconductor device according to the first embodiment of the inventive concept, i.e., a semiconductor device including the diffusion barrier element injection region 105, may exhibit a substantially reduced diffusion of the first conductive dopants in the active part 103. As such, a concentration difference between the first conductive dopants in the active part 103 may be minimized. Accordingly, the increase in the threshold voltage of the semiconductor device may be minimized, thereby realizing improved reliability and electric characteristic of the semiconductor device.

Furthermore, the above-described semiconductor device may include the dielectric pattern 121*a* including a high dielectric material. Accordingly, a capacitance of the semiconductor device may be increased without reducing the thickness of the dielectric pattern 121*a*.

In addition, the above-described semiconductor device may include the first conductive pattern 123*a* that is disposed between the dielectric pattern 121*a* and the second conductive pattern 125*a*. Therefore, diffusion of metal from the dielectric pattern 121*a* toward the second conductive pattern 125*a* may be minimized. Also, as the uppermost surface of the dielectric pattern 121*a* may be disposed at the same level as or lower than the lowermost surface of the first conductive pattern 123*a*, the dielectric pattern 121*a* may be sufficiently separated from side walls of the second conductive pattern 125*a*. Accordingly, diffusion of metal from the dielectric pattern 121*a* toward the second conductive pattern 125*a* may be minimized further. As a result, a semiconductor device with improved reliability and electric properties may be realized.

Hereinafter, a method of forming a semiconductor device according to the first embodiment of the inventive concept will be described. FIGS. 3A to 3E are cross-sectional views of stages in a method of forming a semiconductor device according to the first embodiment of the inventive concept.

Referring to FIG. 3A, the active part 103 may be defined in the substrate 100. The active part 103 may be defined by forming a trench (not shown) in the substrate 100 and filling the trench with an insulating material to form an isolation pattern (not shown). Accordingly, the active part 103 may be a portion of the substrate 100. The substrate 100 may include a semiconductor material, e.g., at least one of silicon and germanium. According to an embodiment of the inventive concept, the active part 103 may be doped with a first conductive dopant.

The diffusion barrier element injection region 105 may be formed in the upper region 103*a* of the active part 103, i.e., in a region of the active pattern 130 adjacent the gate pattern 120. The diffusion barrier element injection region 105 may be formed by injecting a diffusion barrier element into the entire upper region of the active part 103. The diffusion barrier element may decrease the diffusion distances of the first conductive dopants that are doped in the active part 103. The diffusion barrier element may be halogen. For example, the diffusion barrier element may include fluorine.

Figure 3B:
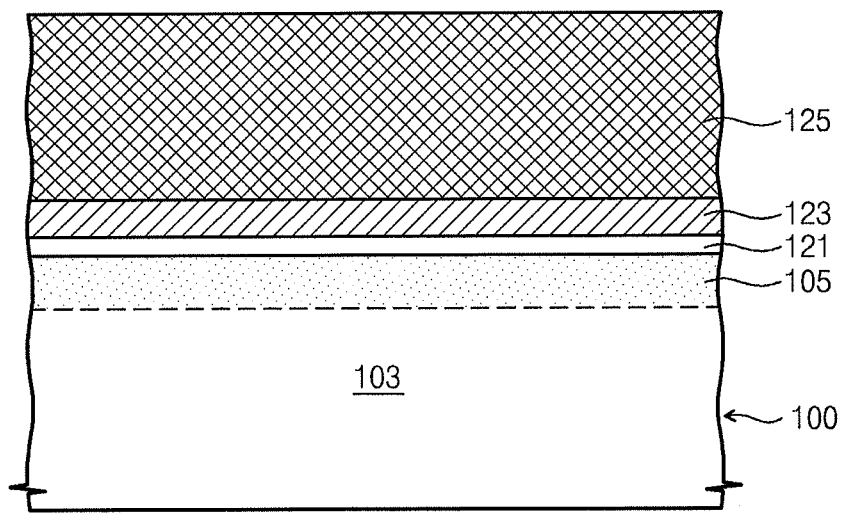

Referring to FIG. 3B, the dielectric layer 121, the first conductive layer 123, and the second conductive layer 125 may be sequentially formed on the active part 103. For example, the dielectric layer 121 may overlap and be directly on the diffusion barrier element injection region 105. The dielectric layer 121 may include a high dielectric material. According to an embodiment of the inventive concept, the high dielectric material may have a dielectric constant higher than that of silicon oxide. For example, the high dielectric material may include at least one of insulation metal oxides, e.g., hafnium oxide, radium oxide, and aluminum oxide.

The first conductive layer 123 may include a conductive metal or metal nitride. For example, the first conductive layer 123 may include at least one of titanium nitride or tantalum nitride. The second conductive layer 125 may include a semiconductor material. For example, the second conductive layer 125 may include multi-crystal poly silicon.

The dielectric layer 121, the first conductive layer 123, and the second conductive layer 125 may be formed by at least one of a Chemical Vapor Deposition (CVD) process, a Physical Vapor Deposition (PVD) process, and an Atomic Layer Deposition (ALD) process.

Figure 3C:
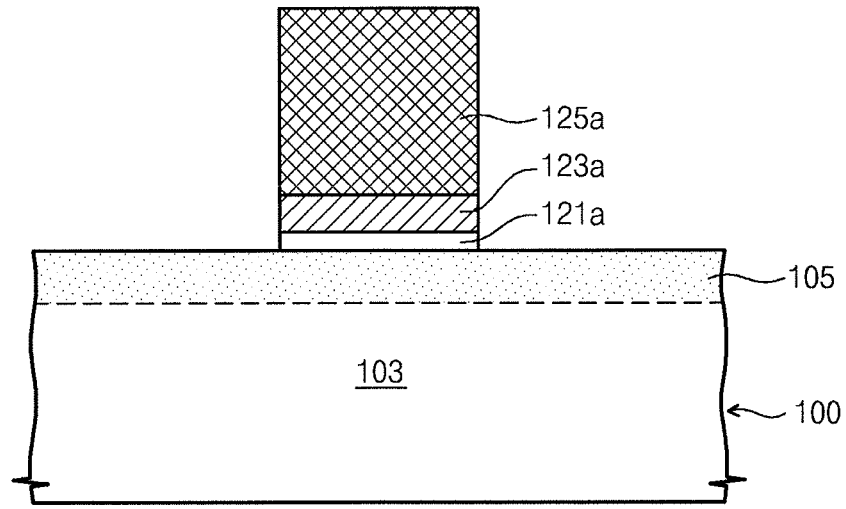

Referring to FIG. 3C, the dielectric pattern 121*a*, the first conductive pattern 123*a*, and the second conductive pattern 125*a* may be formed by sequentially patterning the second conductive layer 125, the first conductive layer 123, and the dielectric layer 121. The patterning process may include at least one or more anisotropic etching processes. Portions of the diffusion barrier element injection region 105 in the active part 103 adjacent to both side walls of the dielectric pattern 121*a* may be exposed by the patterning process.

Figure 3D:
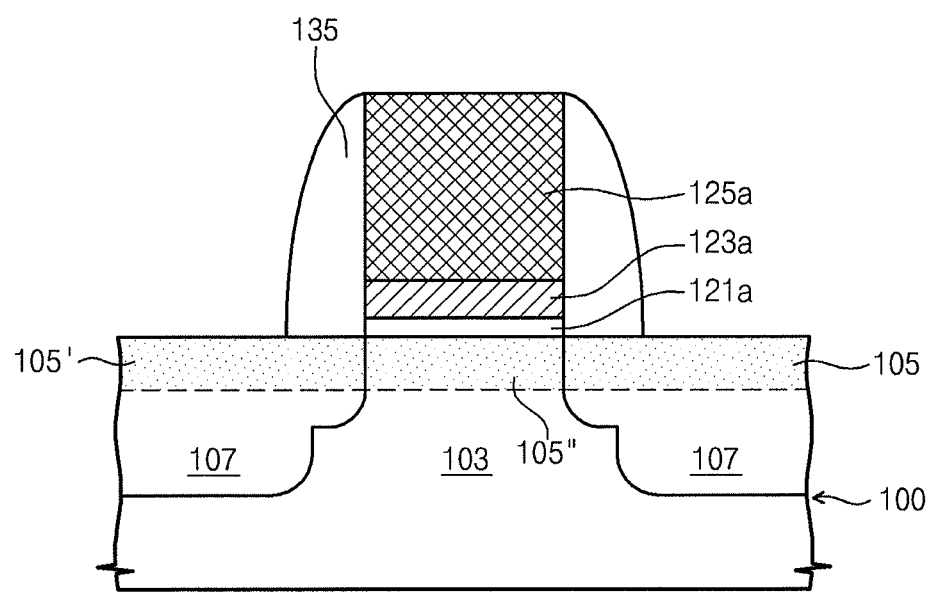

Referring to FIG. 3D, the pair of doping regions 107 may be formed in the active part 103 adjacent to both side walls of the dielectric pattern 121*a*. A portion of the active part 103 between the pair of doping regions 107 may be defined as a channel region. The doping regions 107 may be formed by injecting a second conductive dopant into the active part 103. For example, one of the first and second conductive dopants may be a p-type dopant (for example, boron (B)), and the other may be an n-type dopant (for example, phosphor (P) or arsenic (As)). As an example, the first conductive dopant may be a p-type dopant (for example, boron (B)), and the second conductive dopant may be an n-type dopant (for example, phosphor (P) or arsenic (As)). The doping regions 107 may be formed in the active part 103, and thus a portion of the diffusion barrier element injection region 105 may be disposed in the doping regions 107. For example, the diffusion barrier element injection region 105 may completely overlap upper regions of the doping regions 107, e.g., the diffusion barrier element injection region 105 may be between each doping region 107 and a corresponding spacer 135. The diffusion barrier element injection region 105 may be divided into first sub regions 105' disposed in the doping regions 107, and a second sub region 105" that is disposed in a channel region between the doping regions 107.

Diffusion barrier elements included in the second sub region 105" of the diffusion barrier element injection region 105 may decrease the diffusion distances of the first conductive dopants that are doped in the channel region of the active part 103. Accordingly, concentration non-uniformity of the first conductive dopants in the channel region may be minimized, i.e., increased accumulation of the first conductive dopants along sidewalls of the active part 103 relative to other portions of the active part 103 may be minimized.

Moreover, as the first sub regions 105' of the diffusion barrier element injection region 105 are disposed in the doping regions 107, diffusion barrier elements included in the first sub regions 105' may decrease the diffusion distances of the second conductive dopants included in the doping regions 107. That is, as the second conductive dopants are implanted through the first sub regions 105' to form the doping regions 107, the depths of the doping regions 107 may be decreased. Thus, short channel effects of the semiconductor device according to embodiments of the inventive concept may be minimized.

The doping regions 107 may be formed to have a predetermined depth from the upper surface of the active part 103. According to an embodiment of the inventive concept, the levels of the lowermost surfaces of the doping regions 107 may be lower than those of the lowermost surfaces of the diffusion barrier element injection region 105. That is, a distance between the lowermost surfaces of the doping regions 107 and a bottom of the substrate 100 may be larger than a distance between a corresponding lowermost surface of the diffusion barrier element injection region 105 and the bottom of the substrate 100.

The spacers 135 covering both side walls of the dielectric pattern 121a, first conductive pattern 123a, and second conductive pattern 125a may be disposed on the substrate 100. The spacers 135 may be formed by forming a spacer layer over the substrate 100, and anisotropically-etching the spacer layer until the second conductive pattern 125a is exposed. The spacer layer may be formed by at least one of a CVD process, a PVD process, and an ALD process.

Figure 3E:
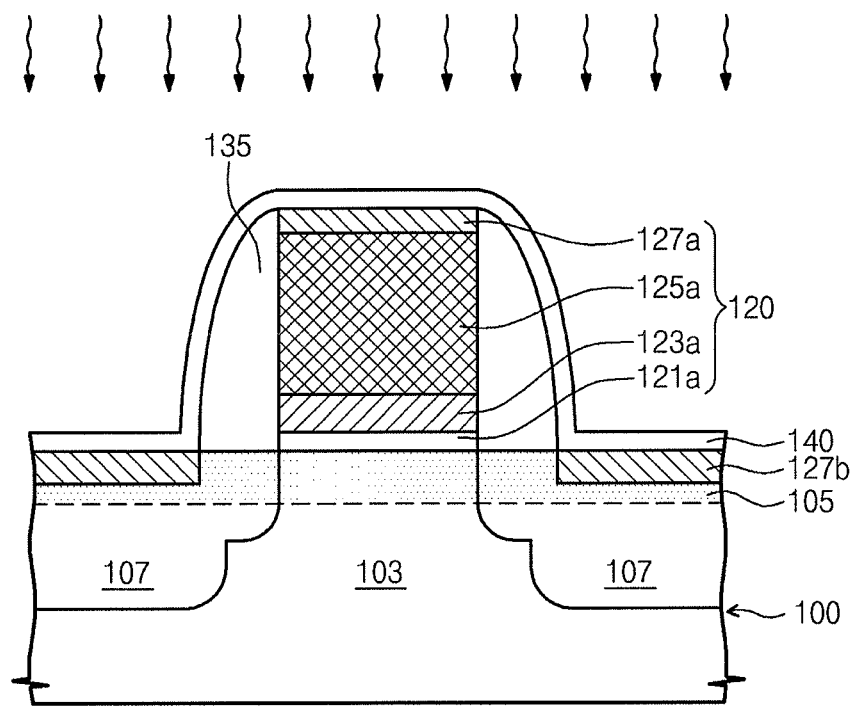

Referring to FIG. 3E, a metal layer 140 may be conformally formed on the substrate 100, e.g., the metal layer 140 may be disposed to directly contact exposed portions of the first sub regions 105' of the diffusion barrier element injection region 105 and exposed portions of the second conductive pattern 125a. The metal layer 140 may include, e.g., nickel or tungsten. The metal layer 140 may be formed by at least one of a CVD process, a PVD process, and an ALD process.

First and second metal-semiconductor compound patterns 127a and 127b may be formed by performing a thermal treatment process on the substrate 100 where the metal layer 140 is formed. If the thermal treatment is applied to the entire metal layer 140 at the same time, the first and second metal-semiconductor compound patterns 127a and 127b may be formed simultaneously.

By the thermal treatment process, a metal included in the metal layer 140 and a semiconductor material included in the second conductive pattern 125a may react with each other, so that the first metal-semiconductor compound pattern 127a is formed. Also, a metal included in the metal layer 140 and a semiconductor material included in the diffusion barrier element injection region 105, i.e., in the active part 103, may react with each other, so that the second metal-semiconductor compound pattern 127b is formed. Therefore, the first metal-semiconductor compound pattern 127a may be formed on, e.g., directly on, the second conductive pattern 125a. The second metal-semiconductor compound pattern 127b may be formed at the upper ends of the doping regions 107 in the active part 103, e.g., directly on a portion of the first sub regions 105' of the diffusion barrier element injection region 105.

The dielectric pattern 121a, the first conductive pattern 123a, the second conductive pattern 125a, and the first metal-semiconductor compound pattern 127a may be included in the gate pattern 120.

When the active part 103 and the second conductive pattern 125a include the same semiconductor material, the first and second metal-semiconductor compound patterns 127a and 127b may include the same metal-semiconductor compound. For example, when the active part 103 includes silicon and the second conductive pattern 125a includes polycrystalline silicon, the first and second metal-semiconductor compound patterns 127a and 127b may include metal silicide.

The metal layer 140 may be removed after forming the first and second metal-semiconductor compound patterns 127a and 127b. The metal layer 140 may be removed, e.g., by a wet etching process.

According to the above-described semiconductor device, the diffusion barrier element injection region 105 including the first sub regions 105' and the second sub region 105" may be disposed in the upper region of the active part 103. The diffusion barrier elements included in the second sub region 105" of the diffusion barrier element injection region 105 may decrease the diffusion distances of the first conductive dopants that are doped in the active part 103, thereby minimizing diffusion of the first conductive dopants toward first side walls of the active part 103. In contrast, a semiconductor device without the diffusion barrier element injection region 105 may include increased accumulation of the first conductive dopants along the first side walls of the active part 103, e.g., in upper regions of the active part 103, due to diffusion. Accordingly, when a width between the first side walls of the active part 103 is progressively reduced, a threshold voltage of the semiconductor device may be increased by the first conductive dopants that are accumulated in the upper region adjacent to the first side walls of the active part 103. As such, reliability and operability of the semiconductor device may be decreased.

According to the first embodiments of the inventive concept, however, formation of the diffusion barrier element injection region 105 may prevent or substantially minimize the diffusion of the first conductive dopants in the active part 103. Thus, the concentration difference between the first conductive dopants in the active part 103, i.e., increased accumulation of the first conductive dopants in an upper portion of the active part 103 as compared to other portions of the active part 130, may be minimized. Accordingly, an increase in the threshold voltage of the semiconductor device may be minimized, thereby realizing a semiconductor device with improved reliability and electric characteristic.

Furthermore, the above-described semiconductor device may include the dielectric pattern 121a having a high dielectric material. Accordingly, capacitance of the semiconductor device may increase without reducing the thickness of the dielectric pattern 121a.

In addition, as the dielectric pattern 121a of the above-described semiconductor device includes metal atoms, the first conductive pattern 123a may be disposed between the dielectric pattern 121a and the second conductive pattern 125a. Therefore, diffusion of metal from the dielectric pattern 121a toward the second conductive pattern 125a may be minimized. Also, as the uppermost surface of the dielectric pattern 121a may be disposed at the same level as or a lower level than that of the lowermost surface of the first conductive pattern 123a, the dielectric pattern 121a may be sufficiently separated from the side walls of the second conductive pattern 125a. That is, as the first conductive pattern 123a may, e.g., completely, separate the dielectric pattern 121a from the second conductive pattern 125a, diffusion of metal from the dielectric pattern 121a toward the second conductive pattern 125a may be further minimized. As a result, a semiconductor device with improved reliability and electric characteristic may be realized.

Second Embodiment

Figure 4:
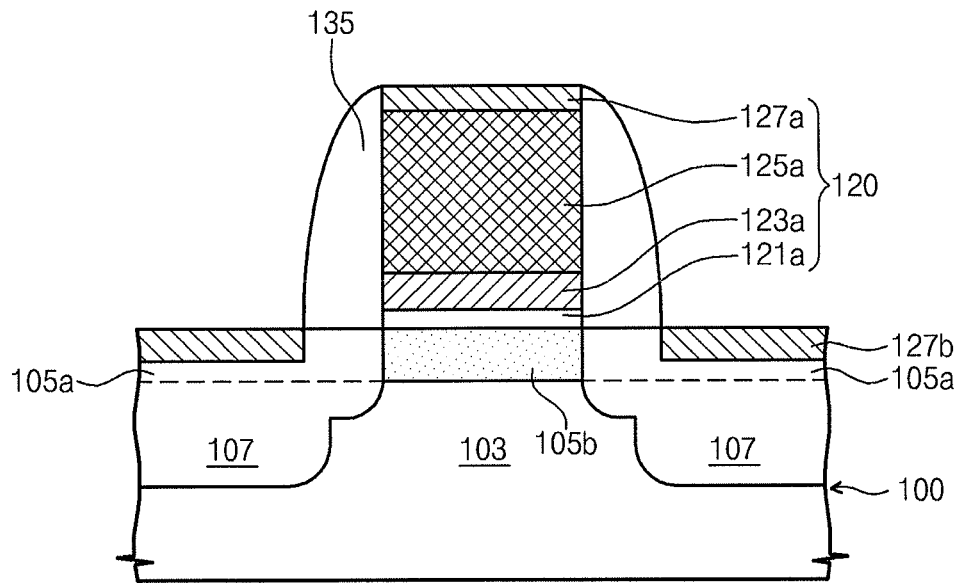
FIG. 4 illustrates a cross-sectional view of a semiconductor device according to a second embodiment of the inventive concept.

Hereinafter, a semiconductor device according to a second embodiment of the inventive concept will be described. FIG. 4 is a sectional view illustrating a semiconductor device according to a second embodiment of the inventive concept. The semiconductor device according to the second embodiment of the inventive concept may include elements of the first embodiment of the inventive concept described above with reference to FIGS. 1-2. Therefore, detailed description of same elements will not be provided.

Referring to FIGS. 1 and 4, the isolation pattern 101 defining the active part 103 may be disposed in the substrate 100. The active part 103 may be doped with the first conductive dopant.

The gate pattern 120 may extend in the second direction across the active part 103 on the substrate 100. The gate pattern 120 may include the dielectric pattern 121a, the first conductive pattern 123a, the second conductive pattern 125a, and the first metal-semiconductor compound pattern 127a. The dielectric pattern 121a, the first conductive pattern 123a, the second conductive pattern 125a, and the first metal-semiconductor compound pattern 127a are the same elements described above with reference to FIG. 2A and FIG. 2B in the first embodiment of the inventive concept.

The doping regions 107 may be disposed in the active part 103 adjacent to both side walls of the gate pattern 120. The active part 103 between the pair of doping regions 107 may be defined as the channel region. The doping regions 107 may be doped with the second conductive dopant. The second conductive dopant may be a type opposite to that of the first conductive dopant. For example, one of the first and second conductive dopants may be a p-type dopant (for example, boron (B)), and the other may be an n-type dopant (for example, phosphor (P) or arsenic (As)). For example, the first conductive dopant may be a p-type dopant (for example, boron (B)), and the second conductive dopant may be an n-type dopant (for example, phosphor (P) or arsenic (As)).

The first and second diffusion barrier element injection regions 105a and 105b may be disposed in the upper region of the active part 103. The first and second diffusion barrier element injection regions 105a and 105b may be formed by injecting a diffusion barrier element into the entire upper region of the active part 103. The diffusion barrier element may include impurities different from the first and second conductive dopants. For example, the diffusion barrier element may be halogen, e.g., the diffusion barrier element may include fluorine.

According to an embodiment of the inventive concept, the first and second diffusion barrier element injection regions 105a and 105b may be formed in the first and second sub regions 105' and 105'', respectively. That is, the first diffusion barrier element injection regions 105a may be disposed in the first sub regions 105', i.e., in upper regions of the doping regions 107, and the second diffusion barrier element injection region 105b may be disposed in the second sub region 105'', i.e., in the channel region of the active part 103 between the doping regions 107. According to an embodiment of the inventive concept, a concentration of the diffusion barrier element of each of the second diffusion barrier element injection region 105b may be lower than a concentration of the diffusion barrier element of the first diffusion barrier element injection region 105a. In other words, the concentration of the diffusion barrier element in the channel region may be lower than the concentration of the diffusion barrier element in each of the doping regions 107, e.g., the concentration of fluorine in the channel region may be lower than the concentration of fluorine in each of the doping regions 107.

As described above, the first and second diffusion barrier element injection regions 105a and 105b formed in respective first and second sub regions 105' and 105'' may have different diffusion barrier element concentrations. Accordingly, a threshold value of each doping region 107 and a threshold value of the channel region of the active part 103 may be satisfied. For example, diffusion barrier elements included in the second sub region 105'' may decrease the diffusion distance of the first conductive dopant in the active part 103, so the concentration non-uniformity of the first conductive dopant in the channel region may be minimized. Similarly, diffusion barrier elements included in the first sub regions 105' may decrease the diffusion distances of the second conductive dopants included in the doping regions 107, so the depths of the doping regions 107 may be decreased to minimize the short channel effects. That is, a concentration of the diffusion barrier elements in each of the first and second diffusion barrier element injection regions 105a and 105b may be adjusted in accordance with the first and second conductive dopants in the doping regions 107 and in the channel region, respectively. Therefore, the demanded values of the doping regions 107 and the demanded value of the channel region of the active part 103 can be satisfied, e.g., the depth of the doping regions 107 and distribution of the first conductive dopant in the channel region may be controlled by the concentration of the diffusion barrier elements.

The second metal-semiconductor compound pattern 127b may be disposed in the upper regions of the doping regions 107. The spacer 135 covering both side walls of the gate pattern 120 may be disposed on the substrate 100. The second metal-semiconductor compound pattern 127b and the spacer 135 may be the same elements described above with reference to FIG. 2A and FIG. 2B in the first embodiment of the inventive concept.

The above-described semiconductor device may include the diffusion barrier element injection regions 105a and 105b that are disposed in the upper region of the active part 103. The diffusion barrier element injection regions 105a and 105b may perform the same function as the diffusion barrier element injection region 105 described above in the first embodiment of the inventive concept. Accordingly, the semiconductor device according to the second embodiment may have the same advantages as those in the first embodiment.

Moreover, the diffusion barrier element injection regions 105a and 105b may be disposed in the first sub regions 105' and the second sub region 105'', and may have different diffusion barrier element concentrations. Accordingly, demanded values of the doping regions 107 and a demanded value of the channel region of the active part 103 may be satisfied.

Figure 5A:
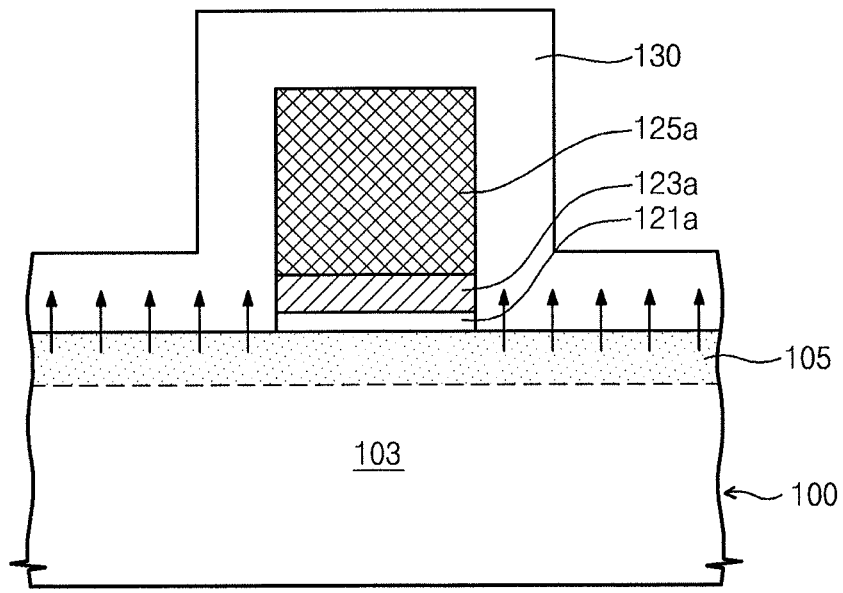
FIGS. 5A to 5C illustrate cross-sectional views of stages in a method of forming a semiconductor device according to a second embodiment of the inventive concept.
Figure 5B:
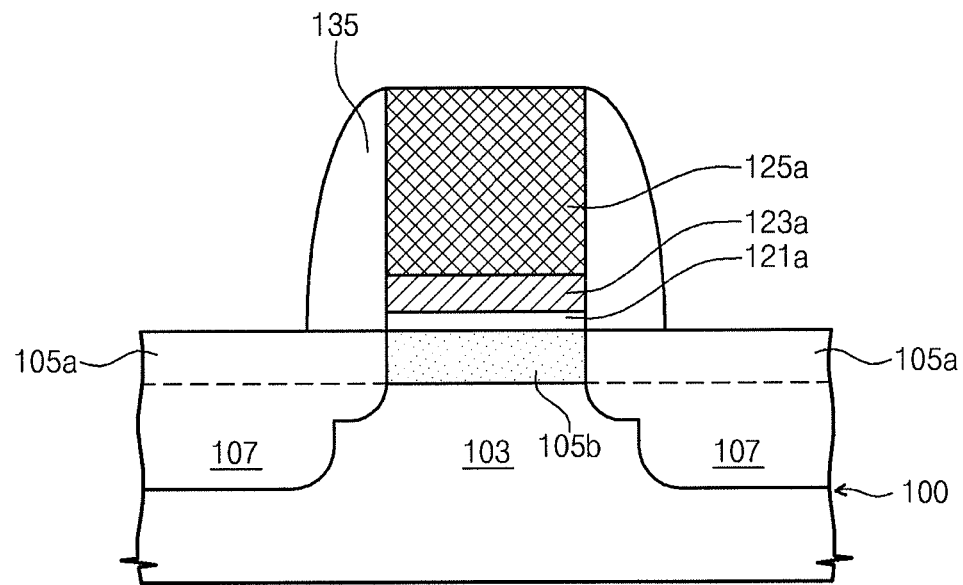
Figure 5C:
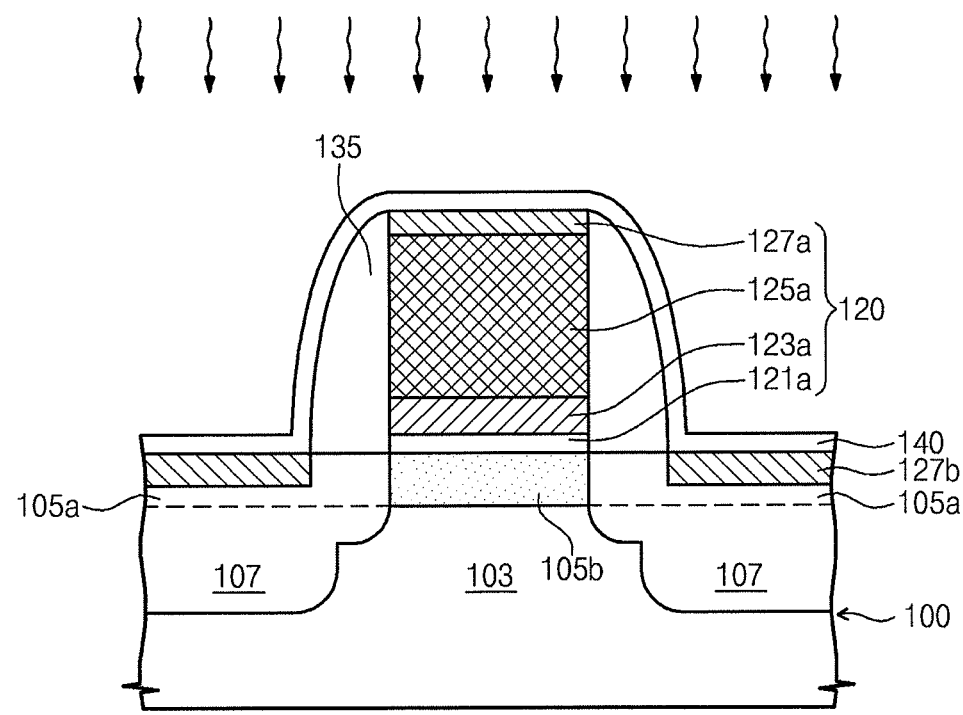

Hereinafter, a method of forming the semiconductor device according to the second embodiment of the inventive concept will be described. FIGS. 5A to 5C are sectional views illustrating a method of forming the semiconductor device according to the second embodiment of the inventive concept. The semiconductor device according to the second embodiment of the inventive concept may include elements of the first embodiment of the inventive concept described above with reference to FIGS. 3A to 3C. Therefore, detailed description thereof will not be repeated.

As described with reference to FIG. 3C, the diffusion barrier element injection region 105 may be formed in the upper region of the active part 103 that is defined in the substrate 100. Also, the dielectric pattern 121a, the first conductive pattern 123a, and the second conductive pattern 125a may be formed on the substrate 100.

Next, as illustrated in FIG. 5A, a material layer 130 may be formed, e.g., conformally, on the substrate 100. The material layer 130 may contact a portion of the diffusion barrier element injection region 105, e.g., the material layer 130 may directly contact an exposed portion of the diffusion barrier element injection region 105. The material layer 130 may include oxide. The material layer 130 may be formed by at least one of a CVD process, a PVD process, and an ALD process.

A thermal treatment process may be performed on the substrate 100 where the material layer 130 is formed. By the thermal treatment process, diffusion barrier elements may move from the diffusion barrier element injection region 105 contacting the material layer 130 to the material layer 130. That is, the material layer 130 may absorb at least some of the diffusion barrier element from the exposed portion of the diffusion barrier element injection region 105. Therefore, a concentration of the diffusion barrier element in the diffusion barrier element injection region 105 contacting the material layer 130 may decrease. By the thermal treatment process, the diffusion barrier element injection region 105 may be divided into the first sub regions 105a having a low diffusion barrier element concentration and into the second sub region 105b disposed between the first sub regions 105a, as illustrated in FIG. 5B.

Diffusion barrier elements included in the second sub region 105b of the diffusion barrier element injection region 105 may decrease the diffusion distances of the first conductive dopants that are doped in the active part 103. Therefore, the diffusion of the first conductive dopants in the active part 103 toward the side walls of the active part 103 may be minimized.

For example, the material layer 130 may be removed after performing the thermal treatment process, e.g., the removal process may include a wet etching process. In another example, the material layer 130 may be etched to form the spacers 135, as will be described below with reference to FIG. 5B.

Referring to FIG. 5B, the doping regions 107 may be formed in the active part 103 adjacent to both side walls of the dielectric pattern 121a. Also, the spacers 135 covering both side walls of the dielectric pattern 121a, first conductive pattern 123a, and second conductive pattern 125a may be formed. The doping regions 107 and the spacers 135 may be formed in the same shapes and structures, as well as by the same processes, as those described above with reference to FIG. 3D in the first embodiment of the inventive concept.

As in the above-described first embodiment of the inventive concept, a portion of the diffusion barrier injection region 105 may be disposed in the doping regions 107. Accordingly, the same effect as that of the above-described first embodiment of the inventive concept may be obtained.

Referring to FIG. 5C, the metal layer 140 may be formed on the substrate 100, and first and second metal-semiconductor compound patterns 127a and 127b may be formed by performing a thermal treatment process on the substrate 100 where the metal layer 140 is formed. The metal layer 140 and the first and second metal-semiconductor compound patterns 127a and 127b may be formed by the same process as described above with reference to FIG. 3E in the first embodiment of the inventive concept.

The dielectric pattern 121a, the first conductive pattern 123a, the second conductive pattern 125a, and the first metal-semiconductor compound pattern 127a may be included in the gate pattern 120. The metal layer 140 may be removed after forming the first and second metal-semiconductor compound patterns 127a and 127b. The metal layer 140 may be removed by a wet etching process.

The above-described semiconductor device may include the diffusion barrier element injection regions 105a and 105b that are disposed in the upper region of the active part 103. The diffusion barrier element injection regions 105a and 105b may perform the same function as the function of the diffusion barrier element injection region 105 described above in the first embodiment of the inventive concept. Accordingly, the same effect and advantages as those of the first embodiment of the may be obtained.

Moreover, the diffusion barrier element injection regions 105a and 105b may include the first sub regions 105' and the second sub region 105" that have different diffusion barrier element concentrations. Accordingly, demanded values of the doping regions 107 and a demanded value of the channel region of the active part 103 may be satisfied.

Third Embodiment

Figure 6:
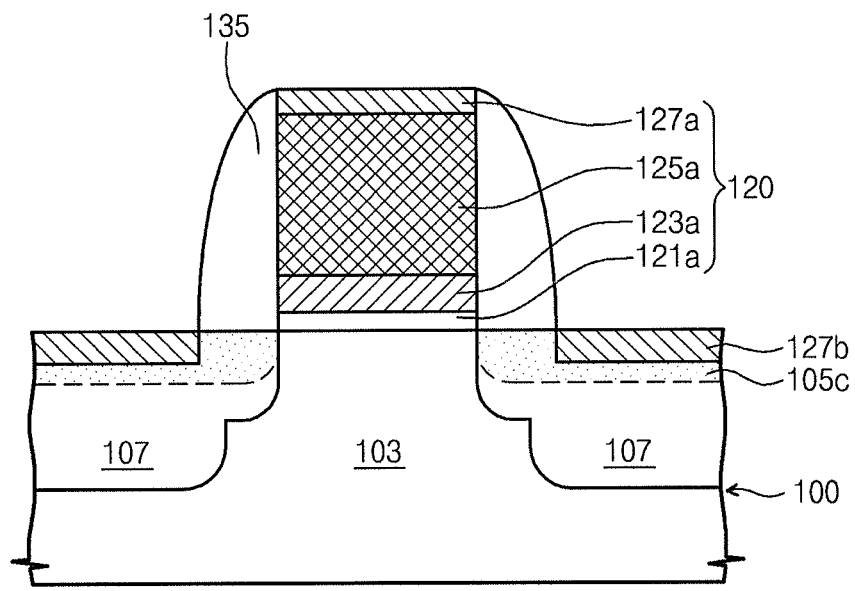
FIG. 6 illustrates a cross-sectional view of a semiconductor device according to a third embodiment of the inventive concept.

Hereinafter, a semiconductor device according to a third embodiment of the inventive concept will be described. FIG. 6 is a sectional view illustrating a semiconductor device according to a third embodiment of the inventive concept. The semiconductor device according to the third embodiment of the inventive concept may include elements described above with reference to FIGS. 1-2. Therefore, detailed description of same elements will not be provided.

Referring to FIGS. 1 and 6, the gate pattern 120 that is extended in the second direction across the active part 103 may be disposed on the substrate 100. The gate pattern 120 may include the dielectric pattern 121a, the first conductive pattern 123a, the second conductive pattern 125a, and the first metal-semiconductor compound pattern 127a. The dielectric pattern 121a, the first conductive pattern 123a, the second conductive pattern 125a, and the first metal-semiconductor compound pattern 127a may have the same shapes and structures as those described above with reference to FIG. 2A and FIG. 2B in the first embodiment of the inventive concept.

The doping regions 107 may be disposed in the active part 103 adjacent to both side walls of the gate pattern 120. The doping regions 107 may have the same shapes and structures as those described above with reference to FIG. 2A and FIG. 2B in the first embodiment of the inventive concept. The doping regions 107 may be doped with the second conductive dopant. The second conductive dopant may be a type opposite to that of the first conductive dopant. For example, one of the first and second conductive dopants may be a p-type dopant (for example, boron (B)), and the other may be an n-type dopant (for example, phosphor (P) or arsenic (As)). For example, the first conductive dopant may be a p-type dopant (for example, boron (B)), and the second conductive dopant may be an n-type dopant (for example, phosphor (P) or arsenic (As)).

A pair of diffusion barrier element injection regions 105c may be disposed in an upper region of the active part 103 adjacent to both side walls of the gate pattern 120. The diffusion barrier element injection regions 105c may be formed by injecting a diffusion barrier element, e.g., only, into a portion of the active part 103 that is exposed by the gate pattern 120. According to an embodiment of the inventive concept, the diffusion barrier element injection regions 105c may overlap the doping regions 107. The diffusion barrier element may be impurities different from the first and second conductive dopants. According to an embodiment of the inventive concept, the diffusion barrier element may be a halogen, e.g., fluorine.

The diffusion barrier elements may decrease the diffusion distances of the second conductive dopants included in the doping regions 107. Accordingly, the depths of the doping regions 107 may be decreased, thereby minimizing short channel effects of the semiconductor device according to embodiments of the inventive concept.

The second metal-semiconductor compound pattern 127b may be disposed in the upper region of the doping regions 107. Also, the spacer 135 covering both side walls of the gate pattern 120 may be disposed on the substrate 100. The second metal-semiconductor compound pattern 127b and the spacer 135 may have the same shapes and structure as those described above with reference to FIG. 2A and FIG. 2B in the first embodiment of the inventive concept.

According to the third embodiments of the inventive concept, the diffusion barrier element injection regions 105c may be disposed in the upper region of the active part 103 adjacent to both side walls of the gate pattern 120, e.g., only in regions separated from the gate pattern 120. Diffusion barrier elements included in the diffusion barrier element injection regions 105c may decrease the diffusion distances of the second conductive dopants included in the doping regions 107. Accordingly, the depths of the doping regions 107 may be decreased, thereby minimizing short channel effects of the semiconductor device. As a result, a semiconductor device with improved reliability and electric characteristic may be realized.

Hereinafter, a method of forming the semiconductor device according to the third embodiment of the inventive concept will be described. FIGS. 7A to 7D are sectional views illustrating a method of forming the semiconductor device according to the third embodiments of the inventive concept. Detailed description of same elements will not be provided.

Figure 7A:
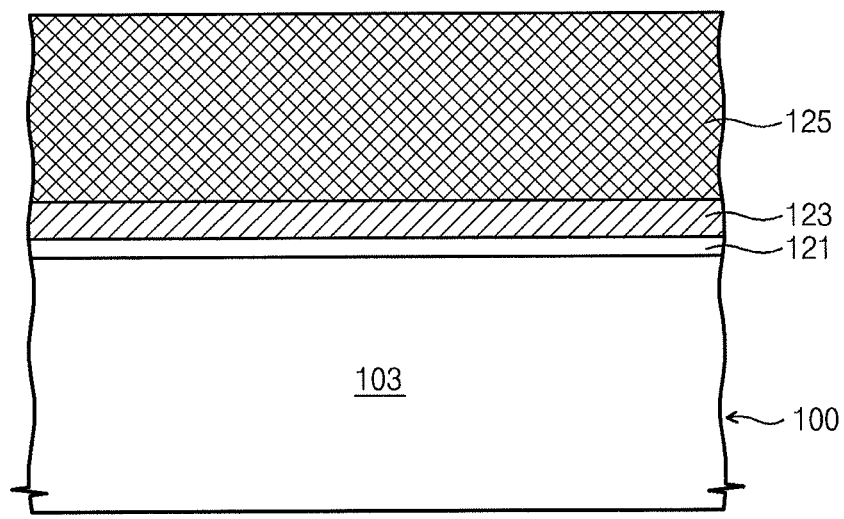
FIGS. 7A to 7D illustrate cross-sectional views of stages in a method of forming a semiconductor device according to a third embodiment of the inventive concept.

Referring to FIG. 7A, the dielectric layer 121, the first conductive layer 123, and the second conductive layer 125 may be sequentially formed on the substrate 100. The active part 103 may be defined in the substrate 100. The substrate 100 and the active part 103 may be formed in the same shapes and structures, as well as by the same processes, as those described above with reference to FIG. 3A in the first embodiment of the inventive concept. The dielectric layer 121, the first conductive layer 123, and the second conductive layer 125 may be formed in the same shapes and structures, as well as same processes, as those described above with reference to FIG. 3B in the first embodiment of the inventive concept.

Figure 7B:
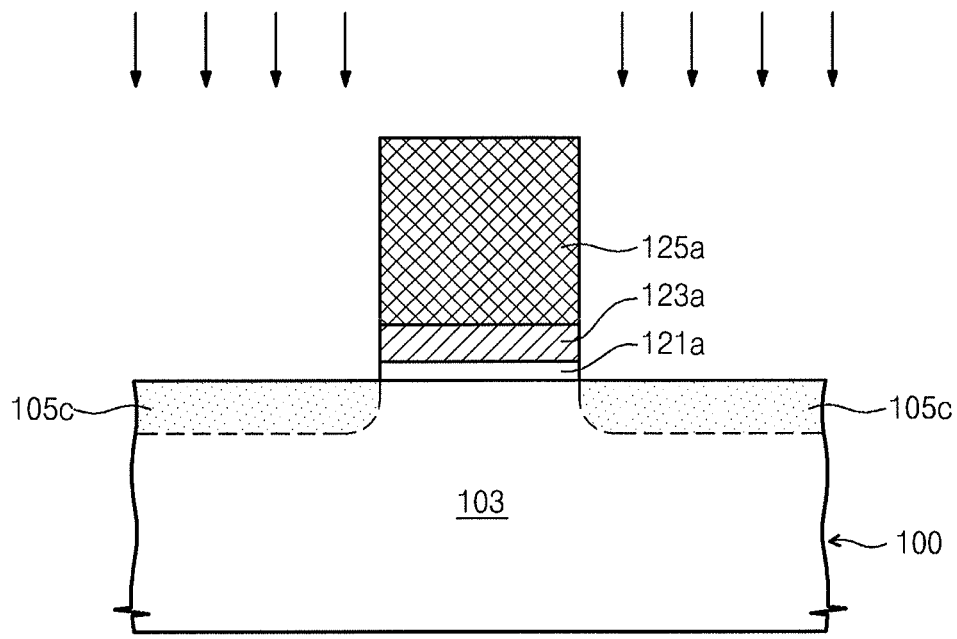
Figure 7C:
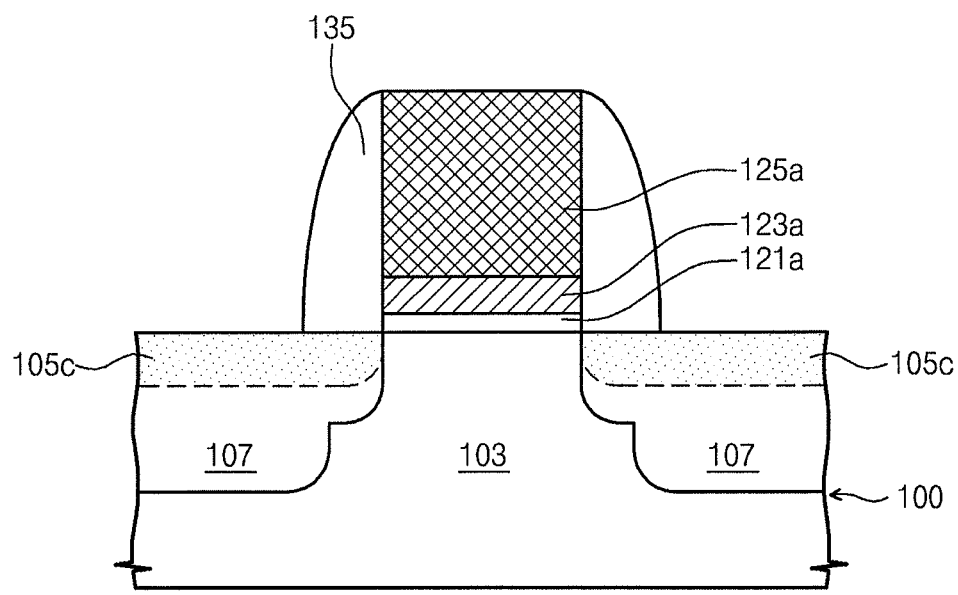

Referring to FIG. 7B, by sequentially patterning the second conductive layer 125, the first conductive layer 123, and the dielectric layer 121, the dielectric pattern 121a, the first conductive pattern 123a, and the second conductive pattern 125a may be sequentially stacked. The dielectric pattern 121a, the first conductive pattern 123a, and the second conductive pattern 125a may be formed in the same shapes and structures, as well as by the same processes, as those described above with reference to FIG. 3C in the first embodiment of the inventive concept.

The pair of diffusion barrier element injection regions 105c may be disposed in the upper region of the active part 103 adjacent to both side walls of the dielectric pattern 121a. The diffusion barrier element injection regions 105c may be formed by injecting the diffusion barrier element into the portion of the active part 103 that is exposed by the dielectric pattern 121a, i.e., the diffusion barrier element injection regions 105c may not be formed in the channel region. The diffusion barrier element may be impurities different from the first and second conductive dopants. According to an embodiment of the inventive concept, the diffusion barrier element may be a halogen, e.g., fluorine.

The pair of doping regions 107 may be formed in the active part 103 adjacent to both side walls of the dielectric pattern 121a. The doping regions 107 may be formed by injecting the second conductive dopant into the active part 103. The doping regions 107 may be formed in the same shapes and structures, as well as same processes, as those described above with reference to FIG. 3D in the first embodiment of the inventive concept. According to an embodiment of the inventive concept, the levels of the lowermost ends, i.e., surfaces, of the doping regions 107 may be lower than those of the lower ends of the diffusion barrier element injection regions 105c.

According to an embodiment of the inventive concept, the diffusion barrier element injection regions 105c may overlap the doping regions 107. The diffusion barrier elements may decrease the diffusion distances of the second conductive dopants that are doped on the doping regions 107. Accordingly, the depths of the doping regions 107 may decrease, thereby minimizing the short channel effects of the semiconductor device.

The spacer 135 covering both side walls of the dielectric pattern 121a, first conductive pattern 123a, and second conductive pattern 125a may be formed on the substrate 100. The spacer 135 may be formed in the same process as that described above with reference to FIG. 3D in the first embodiment of the inventive concept.

Figure 7D:
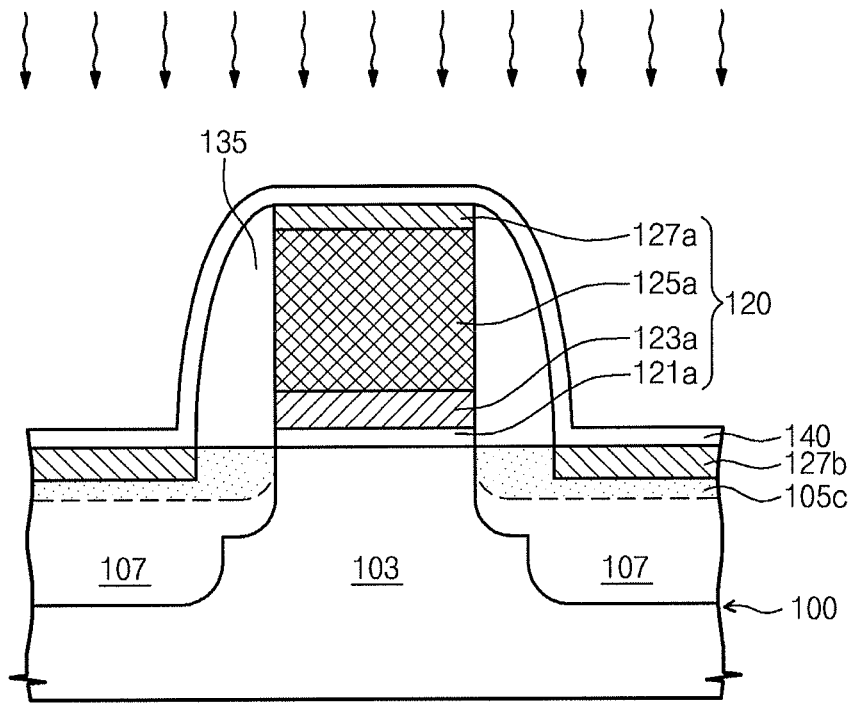

Referring to FIG. 7D, the metal layer 140 may be conformally formed over the substrate 100. The metal layer 140 may be formed in the same process as that described above with reference to FIG. 3E in the first embodiment of the inventive concept. First and second metal-semiconductor compound patterns 127a and 127b may be formed by performing a thermal treatment process on the substrate 100 where the metal layer 140 is formed. The first and second metal-semiconductor compound patterns 127a and 127b may be formed by the same process as that described above with reference to FIG. 3E in the first embodiment of the inventive concept.

The dielectric pattern 121a, the first conductive pattern 123a, the second conductive pattern 125a, and the first metal-semiconductor compound pattern 127a may be included in the gate pattern 120.

The metal layer 140 may be removed after forming the first and second metal-semiconductor compound patterns 127a and 127b. The metal layer 140 may be removed by a wet etching process.

According to the third embodiment of the inventive concept, the diffusion barrier element injection regions 105c may be disposed in the upper region of the active part 103 adjacent to both side walls of the gate pattern 120. Diffusion barrier elements included in the diffusion barrier element injection regions 105c may decrease the diffusion distances of the second conductive dopants that are doped in the doping regions 107. Accordingly, the depths of the doping regions 107 may decrease, thereby minimizing short channel effects of the semiconductor device according to embodiments of the inventive concept. As a result, a semiconductor device with improved reliability and electric characteristic may be realized.

Fourth Embodiment

Figure 8:
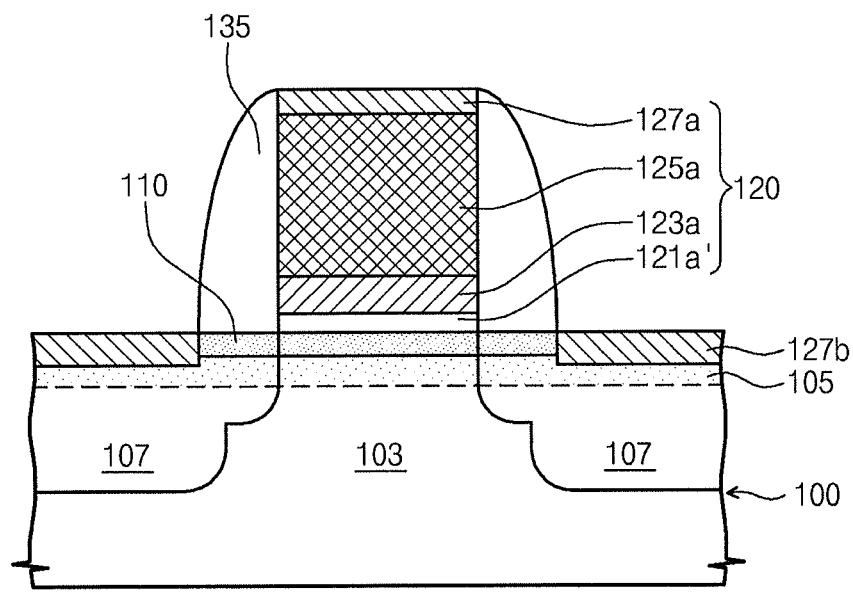
FIG. 8 illustrates a cross-sectional view of a semiconductor device according to a fourth embodiment of the inventive concept.

Hereinafter, a semiconductor device according to a fourth embodiment of the inventive concept will be described. FIG. 8 is a sectional view illustrating a semiconductor device according to a fourth embodiment of the inventive concept.

The semiconductor device according to the fourth embodiment of the inventive concept may include elements described above with reference to FIGS. 1-2. Therefore, detailed description of same elements will not be provided.

Referring to FIGS. 1 and 8, the isolation pattern 101 for defining the active part 103 may be disposed in the substrate 100. The active part 103 may be doped with the first conductive dopant.

The gate pattern 120 that is extended in the second direction across the active part 103 may be disposed on the substrate 100. The gate pattern 120 may include a dielectric pattern 121a', the first conductive pattern 123a, the second conductive pattern 125a, and the first metal-semiconductor compound pattern 127a.

The dielectric pattern 121a' may include a high dielectric material, e.g., a material having a dielectric constant higher than that of silicon oxide. The dielectric pattern 121a' according to an embodiment of the inventive concept may include a non-metal dielectric material, e.g., an oxide, a nitride, and/or an oxynitride, a high dielectric material including at least one metal oxide, e.g., hafnium oxide, aluminum oxide, or the like, a metal-semiconductor-oxygen compound, e.g., a hafnium-silicon-oxygen compound, or the like, and/or a metal-semiconductor-oxygen-nitrogen compound, e.g., a hafnium-silicon-oxygen-nitrogen compound, or the like.

According to an embodiment of the inventive concept, an uppermost surface of the dielectric pattern 121a' may overlap with the first conductive pattern 123a. Accordingly, the uppermost surface of the dielectric pattern 121a' may be disposed at the same level as or lower than that of the lowermost surface of the first conductive pattern 123a. For example, the dielectric pattern 121a' may have a larger width than the first conductive pattern 123a in the y-axis direction, e.g., to entirely cover the substrate 100. In other words, the dielectric pattern 121a' may extend laterally beyond both side walls of the first conductive pattern 123a.

The pair of the doping regions 107 may be disposed in the active part 103 adjacent to both side walls of the gate pattern 120. The doping regions 107 may have a certain depth from the top of the active part 103. The active part 103 between the pair of doping regions 107 may be defined as the channel region. The second conductive dopant may have a type opposite to that of the first conductive dopant. For example, one of the first and second conductive dopants may be a p-type dopant (for example, boron (B)), and the other may be an n-type dopant (for example, phosphor (P) or arsenic (As)). According to an embodiment of the inventive concept, the first conductive dopant may be an n-type dopant (for example, phosphor (P) or arsenic (As)), and the second conductive dopant may be a p-type dopant (for example, boron (B)).

An epitaxial layer 110 may be disposed between the active part 103 and the gate pattern 120, e.g., the epitaxial layer 110 may completely separate between the gate pattern 120 and the active pattern 103. According to an embodiment of the inventive concept, the epitaxial layer 110 may laterally extend across both side walls of the gate pattern 12. For example, the epitaxial layer 110 may have a larger width than the first conductive pattern 123a in the y-axis direction, e.g., to entirely cover the active part 103. According to an embodiment of the inventive concept, the epitaxial layer 110 may include a semiconductor material having an energy band gap smaller than that of a semiconductor material included in the active part 103. For example, when the active part 103 is formed of silicon, the epitaxial layer 110 may include germanium. For example, the epitaxial layer 110 may include at least one of silicon-germanium and germanium.

Since the epitaxial layer 110, which includes a semiconductor material having an energy band gap smaller than that of the semiconductor material included in the active part 103, is disposed between the active part 103 and the gate pattern 120, the channel region may be foamed in the epitaxial layer 110. Accordingly, a threshold voltage of a semiconductor device according to embodiments of the inventive concept may decrease. As a result, electric characteristic of the semiconductor device may improve.

According to an embodiment of the inventive concept, the epitaxial layer 110 may include diffusion barrier elements. The diffusion barrier element may be impurities different from the first and second conductive dopants. For example, the diffusion barrier element may be a halogen, e.g., fluorine.

The diffusion barrier element injection region 105 may be disposed in the upper region of the active part 103. According to an embodiment of the inventive concept, the diffusion barrier element injection region 105 may include a pair of first sub regions that are disposed in upper regions of the doping regions 107, and a second sub region that is disposed in a channel region of the active part 103 between the doping regions 107. A concentration of the diffusion barrier element of each of the first sub regions may be substantially the same as a concentration of the diffusion barrier element of the second sub region.

Diffusion barrier elements included in the second sub region of the diffusion barrier element injection region 105 decrease the oxidization speed of the epitaxial layer 110, and thus can suppress the increase in the equivalent oxide thickness of the dielectric pattern 121a formed on the active part 103. Accordingly, due to the diffusion barrier elements included in the second sub region of the diffusion barrier element injection region 105, a capacitance of the semiconductor device may increase without a change in the thickness of the dielectric pattern 121a'.

Moreover, the first sub regions of the diffusion barrier element injection region 105 may be disposed in the doping regions 107. Diffusion barrier elements included in the first sub regions may decrease the diffusion distances of the second conductive dopants included in the doping regions 107. Accordingly, the depths of the doping regions 107 may decrease, and thus the short channel effect of the semiconductor device according to embodiments of the inventive concept may be minimized.

The second metal-semiconductor compound 127b may be disposed at the upper regions of the doping regions 107. The second metal-semiconductor compound 127b may include a semiconductor material included in the epitaxial layer 110, and/or a semiconductor material included in the active part 103. For example, when the epitaxial layer 110 includes silicon germanium and the active part 103 includes silicon, the second metal-semiconductor compound 127b may include metal-germanium-silicide and/or metal silicide.

For example, the first metal-semiconductor compound 127a and the second metal-semiconductor compound 127b may include different metal-semiconductor compounds, e.g., the first metal-semiconductor compound 127a may include a metal silicide and the second metal-semiconductor compound 127b may include a metal-germanium-silicide. In another example, the first metal-semiconductor compound 127a and the second metal-semiconductor compound 127b may include a same metal-semiconductor compound, e.g., both the first and second metal-semiconductor compounds 127a and 127b may include metal silicide.

The above-described semiconductor device may include the diffusion barrier element injection region 105 and the epitaxial layer 110 in the upper region of the active part 103.

Due to the diffusion barrier elements included in the diffusion barrier element injection region 105 and the epitaxial layer 110, a capacitance of the semiconductor device can increase without a change in the thickness of the dielectric pattern 121a'. Accordingly, a semiconductor device with improved reliability and electric characteristic may be realized.

Hereinafter, a method of forming the semiconductor device according to the fourth embodiment of the inventive concept will be described. FIGS. 9A to 9D are sectional views illustrating a method of forming the semiconductor device according to the fourth embodiment of the inventive concept.

Figure 9A:
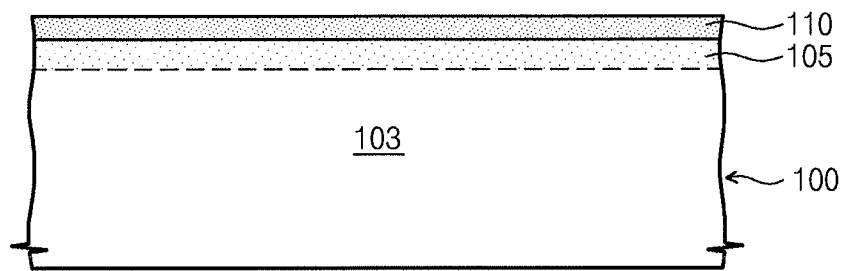
FIGS. 9A to 9D illustrate cross-sectional views of stages in a method of forming a semiconductor device according to a fourth embodiment of the inventive concept.

Referring to FIG. 9A, the active part 103 may be defined in the substrate 100. The active part 103 may be formed in the same process as described above with reference to FIG. 3A in the first embodiment of the inventive concept. The active part 103 may be doped with the first conductive dopant.

The diffusion barrier element injection region 105 may be disposed in the upper region of the active part 103. The diffusion barrier element injection region 105 may be formed by injecting the diffusion barrier element into the entire upper region of the active part 103. The diffusion barrier element may be impurities different from the first and second conductive dopants. For example, one of the first and second conductive dopants may be a p-type dopant (for example, boron (B)), and the other may be an n-type dopant (for example, phosphor (P) or arsenic (As)). According to an embodiment of the inventive concept, the first conductive dopant may be an n-type dopant (for example, phosphor (P) or arsenic (As)), and the second conductive dopant may be a p-type dopant (for example, boron (B)).

According to an embodiment of the inventive concept, the diffusion barrier element may be halogen. For example, the diffusion barrier element may include fluorine.

For example, the epitaxial layer 110 may be formed at the top of the active part 103, e.g., directly on the diffusion barrier element injection region 105. The epitaxial layer 110 may be formed by growing a semiconductor compound in an epitaxial process that uses the upper region of the active part 103, where the diffusion barrier element injection region 105 is formed, as a seed layer, e.g., the diffusion barrier element injection region 105 may be used as a seed layer. The epitaxial layer 110 may include diffusion barrier elements included in the diffusion barrier element injection region 105. According to an embodiment of the inventive concept, the epitaxial layer 110 may include a semiconductor material having an energy band gap smaller than that of the semiconductor material included in the active part 103. For example, when the active part 103 includes silicon, the epitaxial layer 110 may include a silicon-germanium compound. The epitaxial layer 110 may entirely cover the active part 103.

In another example, the epitaxial layer 110 may be formed before the diffusion barrier element injection region 105. That is, the epitaxial layer 110 may be formed at the top of the active part 103 by using the active part 103 as a seed layer, followed by injecting diffusion barrier elements into the upper region of the active part 103 and the epitaxial layer 110 to form the diffusion barrier element injection region 105. In a process that forms the diffusion barrier element injection region 105, diffusion barrier elements may be injected into the epitaxial layer 110. Accordingly, the epitaxial layer 110 may include diffusion barrier elements included in the diffusion barrier element injection region 105.

Figure 9B:
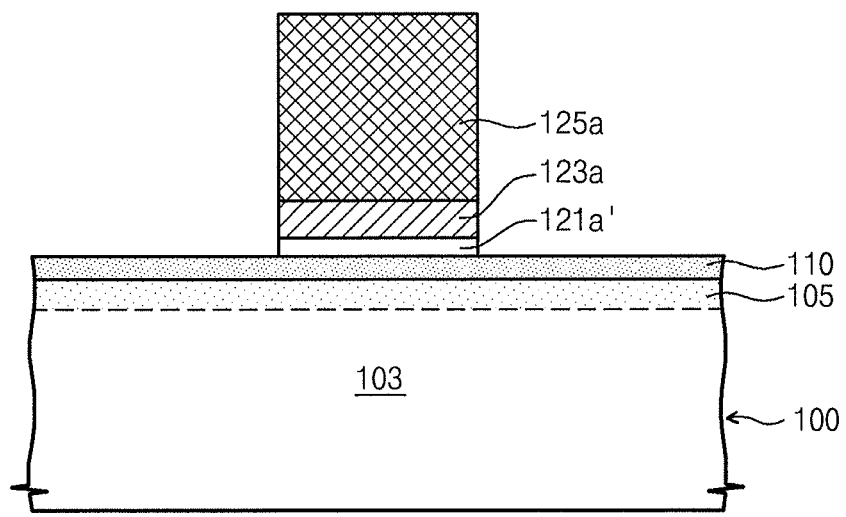

Referring to FIG. 9B, the dielectric pattern 121a', the first conductive pattern 123a, and the second conductive pattern 125a may be sequentially stacked on the substrate 100. The first conductive pattern 123a and the second conductive pattern 125a may be formed in the same shapes and structures, as well as by the same processes, as those described above with reference to FIGS. 3B and 3C in the first embodiment of the inventive concept.

Figure 9C:
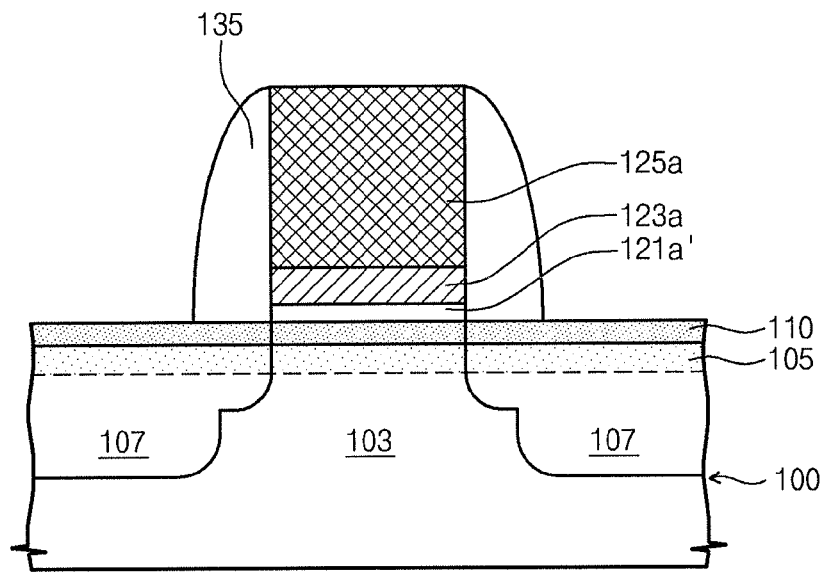

Referring to FIG. 9C, the pair of doping regions 107 may be formed in the active part 103 adjacent to both side walls of the dielectric pattern 121a'. The doping regions 107 may be doped with the second conductive dopant. Also, the spacer 135 covering both side walls of the dielectric pattern 121a', first conductive pattern 123a, and second conductive pattern 125a may be formed on the substrate 100. The doping regions 107 and the spacer 135 may be formed in the same shapes and structure, as well as same processes, as those described above with reference to FIG. 3D in the first embodiment of the inventive concept.

Figure 9D:
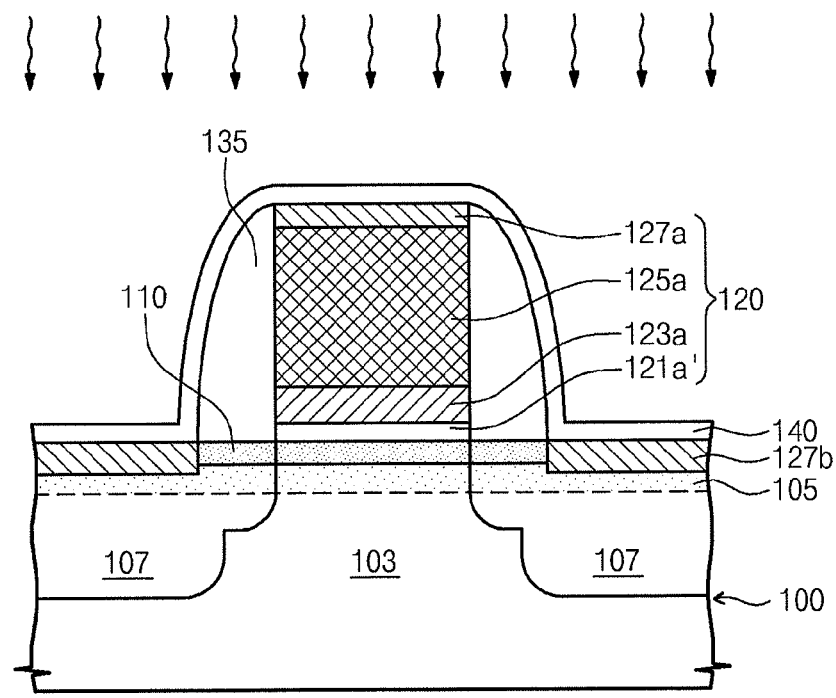

Referring to FIG. 9D, the metal layer 140 may be conformally formed over the substrate 100. First and second metal-semiconductor compound patterns 127a and 127b may be formed by performing a thermal treatment process on the substrate 100.

By a thermal treatment process, the metal included in the metal layer 140 and the semiconductor material included in the second conductive pattern 125a may react with each other so that the first metal-semiconductor compound pattern 127a may be formed. Also, the metal included in the metal layer 140 and the semiconductor material included in the epitaxial layer 110 and/or the active part 103 may react with each other so that the second metal-semiconductor compound pattern 127b may be formed. Accordingly, the first metal-semiconductor compound pattern 127a may be formed on the second conductive pattern 125a, and the second metal-semiconductor compound pattern 127b may be formed at the upper ends of the doping regions.

For example, when the semiconductor material included in the active part 103 is the same as the semiconductor material included in the second conductive pattern 125a, the first and second metal-semiconductor compound patterns 127a and 127b may include the same metal-semiconductor compound. For example, when the active part 103 includes silicon and the second conductive pattern 125a includes polycrystalline silicon, the first and second metal-semiconductor compound patterns 127a and 127b may include metal silicide.

In another example, when the semiconductor material included in the second conductive pattern 125a differs from the semiconductor material included in the epitaxial layer 110, the first and second metal-semiconductor compound patterns 127a and 127b may include different metal-semiconductor compounds. For example, when the epitaxial layer 110 includes silicon-germanium and the second conductive pattern 125a includes polycrystalline silicon, the first metal-semiconductor compound 127a may include metal silicide, and the second metal-semiconductor compound 127b may include metal-germanium-silicide.

The dielectric pattern 121a', the first conductive pattern 123a, the second conductive pattern 125a, and the first metal-semiconductor compound pattern 127a may be included in the gate pattern 120. After forming the first and second metal-semiconductor compound patterns 127a and 127b, the metal layer 140 may be removed, e.g., by a wet etching process.

As described with respect to the first embodiment of the inventive concept, the diffusion barrier element injection region 105 may be disposed in the upper region of the active part 103. Due to the diffusion barrier elements included in the diffusion barrier element injection region 105, a capacitance of the semiconductor device may increase without a change in the thickness of the dielectric pattern 121a. Accordingly, a semiconductor device with improved reliability and electric characteristic may be realized.

Fifth Embodiment

Figure 10:
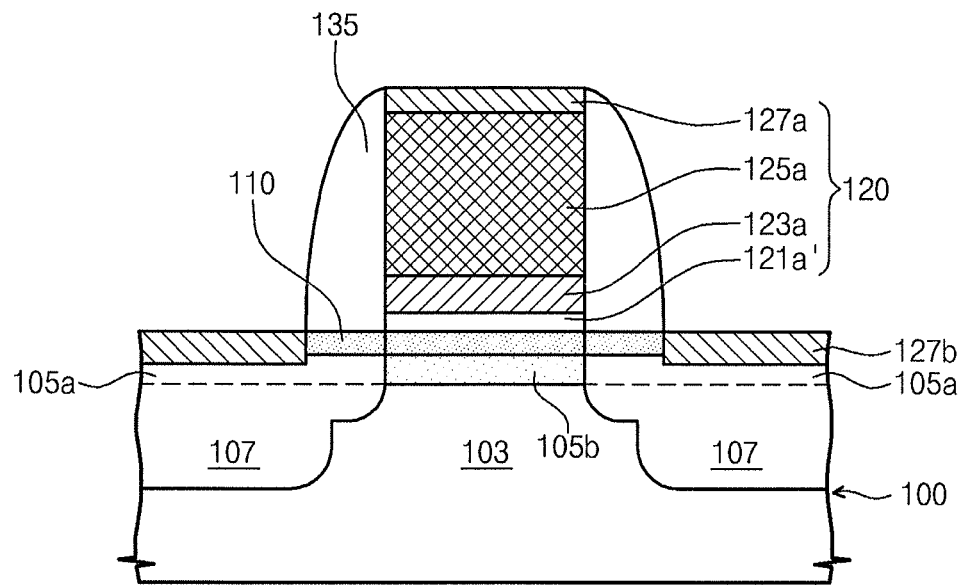
FIG. 10 illustrates a cross-sectional view of a semiconductor device according to a fifth embodiment of the inventive concept.

Hereinafter, a semiconductor device according to a fifth embodiment of the inventive concept will be described. FIG. 10 is a sectional view illustrating a semiconductor device according to a fifth embodiment of the inventive concept. The semiconductor device according to the fifth embodiment of the inventive concept may include elements described above with reference to FIGS. 1-2. Therefore, detailed description of same elements will not be provided.

Referring to FIGS. 1 and 10, the isolation pattern 101 for defining the active part 103 may be disposed in the substrate 100. The active part 103 may be doped with the first conductive dopant.

The gate pattern 120 that is extended in the second direction across the active part 103 may be disposed on the substrate 100. The gate pattern 120 may include the dielectric pattern 121a', the first conductive pattern 123a, the second conductive pattern 125a, and the first metal-semiconductor compound pattern 127a.

The dielectric pattern 121a' may have the same shape and structure as those described above with reference to FIG. 8 in the fourth embodiment of the inventive concept. Also, the first conductive pattern 123a and the second conductive pattern 125a may have the same elements as those described above with reference to FIG. 2A and FIG. 2B in the first embodiment of the inventive concept.

The pair of doping regions 107 may be disposed in the active part 103 adjacent to both side walls of the gate pattern 120. The doping regions 107 may have the same shape and structure as those described above with reference to FIG. 8 in the fourth embodiment of the inventive concept.

The epitaxial layer 110 may be disposed between the active part 103 and the gate pattern 120. The epitaxial layer 110 may have the same shape and structure as those described above with reference to FIG. 8 in the fourth embodiment of the inventive concept. Accordingly, the same effect as that of the above-described fourth embodiment of the inventive concept can be obtained.

The diffusion barrier element injection regions 105a and 105b may be disposed in the upper region of the active part 103. The diffusion barrier element may be impurities different from the first and second conductive dopants. According to an embodiment of the inventive concept, the diffusion barrier element may be halogen, e.g., fluorine.

According to an embodiment of the inventive concept, the diffusion barrier element injection regions 105a and 105b may be in the first sub regions 105' that are disposed in upper regions of the doping regions 107, and in the second sub region 105" that is disposed in a channel region of the active part 103 between the doping regions 107. The diffusion barrier element concentration of each of the first sub regions 105' may be lower than the diffusion barrier element concentration of the second sub region 105". Accordingly, the demanded values of the doping regions 107 and the channel region of the active part 103 may be satisfied. For example, diffusion barrier elements included in the second sub region 105" may decrease the oxidization speed of the epitaxial layer 110, and thus may suppress the increase in the equivalent oxide thickness of the dielectric pattern 121a' formed on the active part 103. Accordingly, due to the diffusion barrier elements included in the diffusion barrier element injection region 105b, i.e., above the channel region, a capacitance of the semiconductor device may be increased without changing the thickness of the dielectric pattern 121a'.

Moreover, diffusion barrier elements included in the first sub regions 105' may decrease the diffusion distances of the second conductive dopants included in the doping regions 107. Accordingly, the depths of the doping regions 107 can decrease, and thus the short channel effect of the semiconductor device according to embodiments of the inventive concept may be minimized.

The spacer 135 covering both side walls of the gate pattern 120 may be disposed on the substrate 100. The spacer 135 may be the same described above with reference to FIG. 2A and FIG. 2B in the first embodiment of the inventive concept.

The second metal-semiconductor compound pattern 127b may be disposed in the upper regions of the doping regions 107. The second metal-semiconductor compound pattern 127b is the same element described above with reference to FIG. 8 in the fourth embodiment of the inventive concept.

The above-described semiconductor device may include the diffusion barrier element injection regions 105a and 105b that are disposed in the upper region of the active part 103. The diffusion barrier element injection regions 105a and 105b may be in the first sub regions 105' and the second sub region 105", and may have different diffusion barrier element concentrations. Accordingly, demanded values of the doping regions 107 and channel region of the active part 103 may be satisfied.

The first sub regions 105' may be disposed in the doping regions 107. Diffusion barrier elements included in the first sub regions 105' may decrease the diffusion distances of the second conductive dopants that are doped on the doping regions 107. Accordingly, the depths of the doping regions 107 can decrease, and thus the short channel effect of the semiconductor device according to embodiments of the inventive concept may be minimized. As a result, a semiconductor device with improved reliability and electric characteristic can be realized. In addition, due to the diffusion barrier elements included in the diffusion barrier element injection region 105b, a capacitance of the semiconductor device can increase without a change in the thickness of the dielectric pattern 121a'.

Figure 11A:
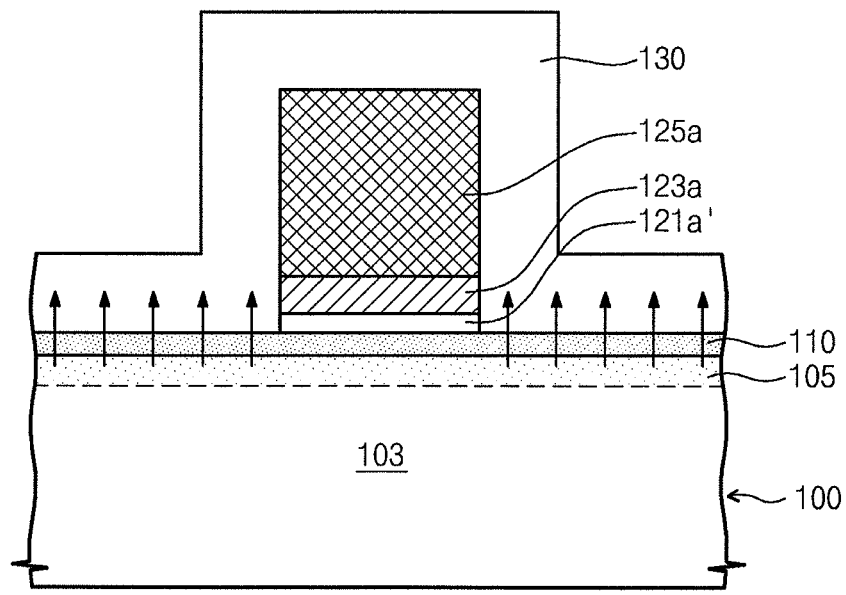
FIGS. 11A to 11C illustrate cross-sectional views of stages in a method of forming a semiconductor device according to a fifth embodiment of the inventive concept.
Figure 11B:
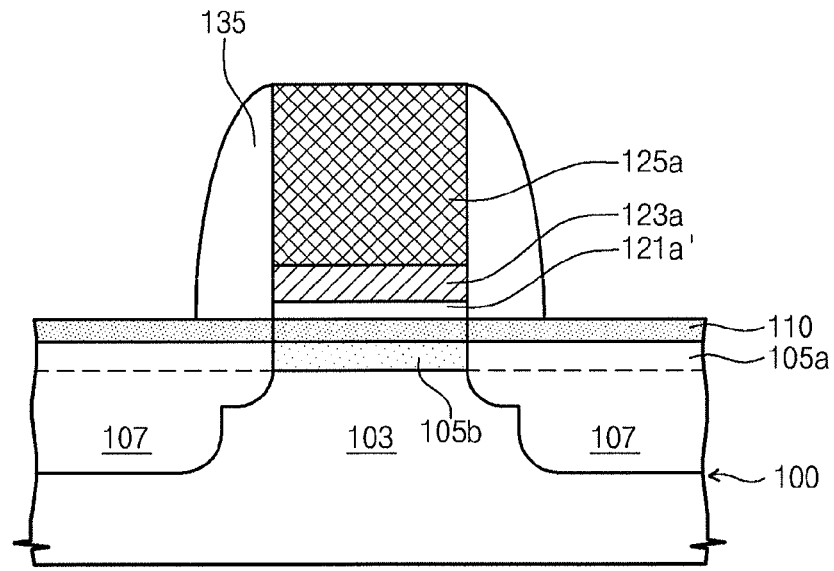
Figure 11C:
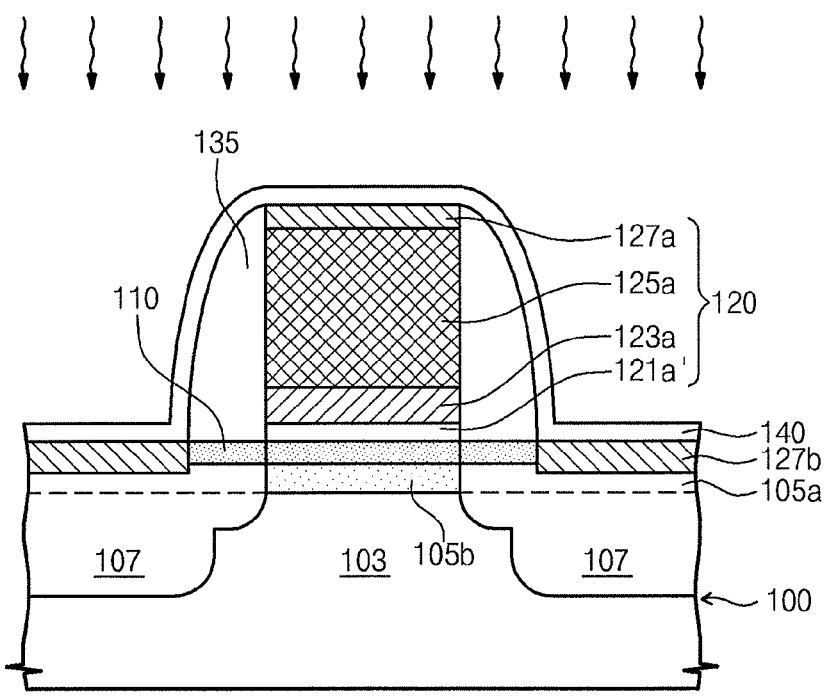

Hereinafter, a method of forming the semiconductor device according to the fifth embodiment of the inventive concept will be described. FIGS. 11A to 11C are sectional views illustrating a method of forming the semiconductor device according to the fifth embodiment of the inventive concept. The semiconductor device according to the fifth embodiment of the inventive concept may include elements described above with reference to FIGS. 3A to 3C. Therefore, detailed description of same elements will not be provided.

Referring to FIG. 11A, the epitaxial layer 110 may be formed on the active part 103 that is defined in the substrate 100, and the diffusion barrier element injection region 105 may be formed in the upper region of an active part 103. The epitaxial layer 110 and the diffusion barrier element injection region 105 may be formed in the same processes as those described above with reference to FIG. 9A in the fourth embodiment of the inventive concept.

The dielectric pattern 121a', the first conductive pattern 123a, and the second conductive pattern 125a may be formed on the substrate 100. The dielectric pattern 121a', the first conductive pattern 123a, and the second conductive pattern 125a may be formed in the same shapes and structures, as well as same processes, as those described above with reference to FIG. 9B.

The material layer 130 may be formed over the substrate 100. The material layer 130 may contact a portion of the epitaxial layer 110. The material layer 130 may be formed by at least one of a CVD process, a PVD process, and an ALD process. The material layer 130 may include oxide. In a patterning process for forming the dielectric pattern 121a', the first conductive pattern 123a, and the second conductive pattern 125a, the material layer 130 may directly contact a portion of the epitaxial layer 110.

A thermal treatment process may be performed on the substrate 100 where the material layer 130 is formed. By the thermal treatment process, diffusion barrier elements may move from the diffusion barrier element injection region 105 in the active part 103 adjacent to both side walls of the dielectric pattern 121a' and/or a portion of the epitaxial layer 110 adjacent to both side walls of the dielectric pattern 121a' to the material layer 130. That is, the material layer 130 may absorb the diffusion barrier elements. Accordingly, a concentration of the diffusion barrier element of the diffusion barrier element injection region 105 in the active part 103 adjacent to both side walls of the dielectric pattern 121a' may decrease. By the thermal treatment process, the diffusion barrier element injection region 105 may be divided into first sub regions 105' having a low diffusion barrier element concentration, and a second sub region 105" disposed between the first sub regions 105'. A concentration of the diffusion barrier element of each of the first sub regions 105' may be lower than a concentration of the diffusion barrier element in the second sub region 105".

For example, after performing the thermal treatment process, the material layer 130 may be removed, e.g., by a wet etching process. In another example, the material layer 130 may not be removed, but may be used as a spacer layer to form the spacers 135.

Referring to FIG. 11B, doping regions 107 may be formed in the active part 103 adjacent to both side walls of the dielectric pattern 121a'. Also, the spacers 135 covering both side walls of the dielectric pattern 121a', first conductive pattern 123a, and second conductive pattern 125a may be formed. The doping regions 107 and the spacers 135 may be formed in the same shapes and structures, as well as same processes, as those described above with reference to FIG. 3D in the first embodiment of the inventive concept.

Referring to FIG. 11C, the metal layer 140 may be formed on the substrate 100, and first and second metal-semiconductor compound patterns 127a and 127b may be formed by performing a thermal treatment process on the substrate 100 where the metal layer 140 is formed. The metal layer 140 may be formed in the same shape and structure, as well as same process, as those described above with reference to FIG. 3E in the first embodiment of the inventive concept.

After forming the first and second metal-semiconductor compound patterns 127a and 127b, the metal layer 140 may be removed. The metal layer 140 may be removed by a wet etching process.

The above-described semiconductor device may include the diffusion barrier element injection regions 105a and 105b that are disposed in the upper region of the active part 103. The diffusion barrier element injection regions 105a and 105b may have different diffusion barrier element concentrations. Accordingly, demanded values of the doping regions 107 and channel region of the active part 103 may be satisfied.

The first sub regions 105' may be disposed in the doping regions 107, so diffusion barrier elements included in the first sub regions 105' may decrease the diffusion distances of the second conductive dopants that are doped on the doping regions 107. Accordingly, the depths of the doping regions 107 can decrease, and thus the short channel effect of the semiconductor device according to embodiments of the inventive concept may be minimized. As a result, a semiconductor device with improved reliability and electric characteristic can be realized. In addition, due to the diffusion barrier elements included in the diffusion barrier element injection region 105b, a capacitance of the semiconductor device can increase without the change in the thickness of the dielectric pattern 121a'.

Sixth Embodiment

Figure 12:
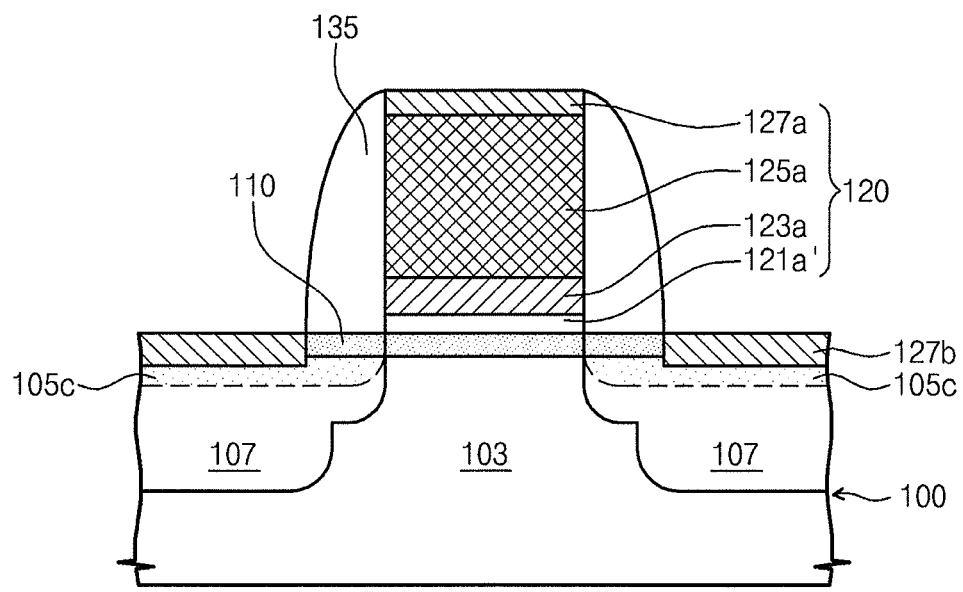
FIG. 12 illustrates a cross-sectional view of a semiconductor device according to a sixth embodiment of the inventive concept.

Hereinafter, a semiconductor device according to a sixth embodiment of the inventive concept will be described. FIG. 12 is a sectional view illustrating a semiconductor device according to a sixth embodiment of the inventive concept. The semiconductor device according to the sixth embodiment of the inventive concept may include elements described above with reference to FIGS. 1-2. Therefore, detailed description of same elements will not be provided.

Referring to FIGS. 1 and 12, the isolation pattern 101 for defining the active part 103 may be disposed in the substrate 100. The active part 103 may be doped with the first conductive dopant.

The gate pattern 120 that is extended in the second direction across the active part 103 may be disposed on the substrate 100. The gate pattern 120 may include the dielectric pattern 121a', the first conductive pattern 123a, the second conductive pattern 125a, and the first metal-semiconductor compound pattern 127a.

The pair of doping regions 107 may be disposed in the active part 103 adjacent to both side walls of the gate pattern 120. The epitaxial layer 110 may be disposed between the active part 103 and the gate pattern 120. The epitaxial layer 110 may have the same shape and structure as those described above with reference to FIG. 8 in the fourth embodiment of the inventive concept. Accordingly, the above-described semiconductor device may have the same effect as that of the above-described fourth embodiment of the inventive concept.

The pair of diffusion barrier element injection regions 105c may be disposed in an upper region of the active part 103 adjacent to both side walls of the gate pattern 120. The diffusion barrier element injection regions 105c may be formed by injecting a diffusion barrier element into an active part 103 and/or an epitaxial layer 110 that is/are exposed from the gate pattern 120. According to an embodiment of the inventive concept, the diffusion barrier element injection regions 105c may overlap with doping regions 107. The diffusion barrier element may be impurities different from the first and second conductive dopants. According to an embodiment of the inventive concept, the diffusion barrier element may be halogen, e.g., fluorine.

The diffusion barrier elements may decrease the diffusion distances of the second conductive dopants included in the doping regions 107. Accordingly, the depths of the doping regions 107 can decrease, and thus the short channel effect of the semiconductor device according to embodiments of the inventive concept may be minimized.

The second metal-semiconductor compound pattern 127b may be disposed in the upper regions of the doping regions 107. Also, the spacer 135 covering both side walls of the gate pattern 120 may be disposed on the substrate 100. The second metal-semiconductor compound pattern 127b and the spacer 135 are the same elements described above with reference to FIG. 2A and FIG. 2B in the first embodiment of the inventive concept.

The diffusion barrier element injection regions 105c according to the sixth embodiments of the inventive concept may be disposed in the upper region of the active part 103 adjacent to both side walls of the gate pattern 120. Diffusion barrier elements included in the diffusion barrier element injection regions 105c may decrease the diffusion distances of the second conductive dopants included in the doping regions 107. Accordingly, the depths of the doping regions 107 can decrease, and thus the short channel effect of the semiconductor device according to embodiments of the inventive concept may be minimized. As a result, a semiconductor device with improved reliability and electric characteristic can be realized.

Hereinafter, a method of forming the semiconductor device according to the sixth embodiment of the inventive concept will be described. FIGS. 13A to 13D are sectional views illustrating a method of forming the semiconductor device according to the sixth embodiments of the inventive concept.

Figure 13A:
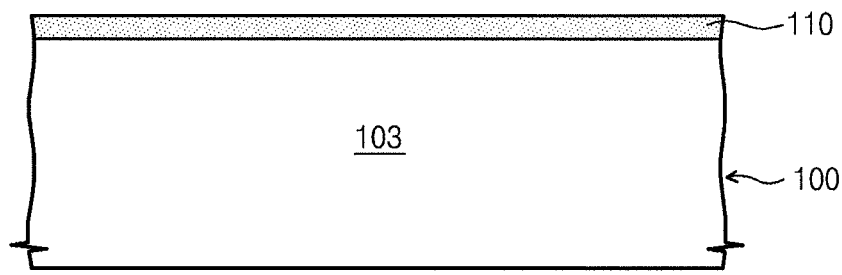
FIGS. 13A to 13D illustrate cross-sectional views of stages in a method of forming a semiconductor device according to a sixth embodiment of the inventive concept.

Referring to FIG. 13A, the epitaxial layer 110 may be formed on the active part 103 that is defined in the substrate 100. The epitaxial layer 110 may be formed by growing a semiconductor compound in an epitaxial process that uses the upper region of the active part 103 as a seed layer. According to an embodiment of the inventive concept, the epitaxial layer 110 may include a semiconductor material having an energy band gap smaller than that of a semiconductor material included in the active part 103. For example, when the active part 103 includes silicon, the epitaxial layer 110 may include a silicon-germanium compound. The epitaxial layer 110 may entirely cover the active part 103.

Figure 13B:
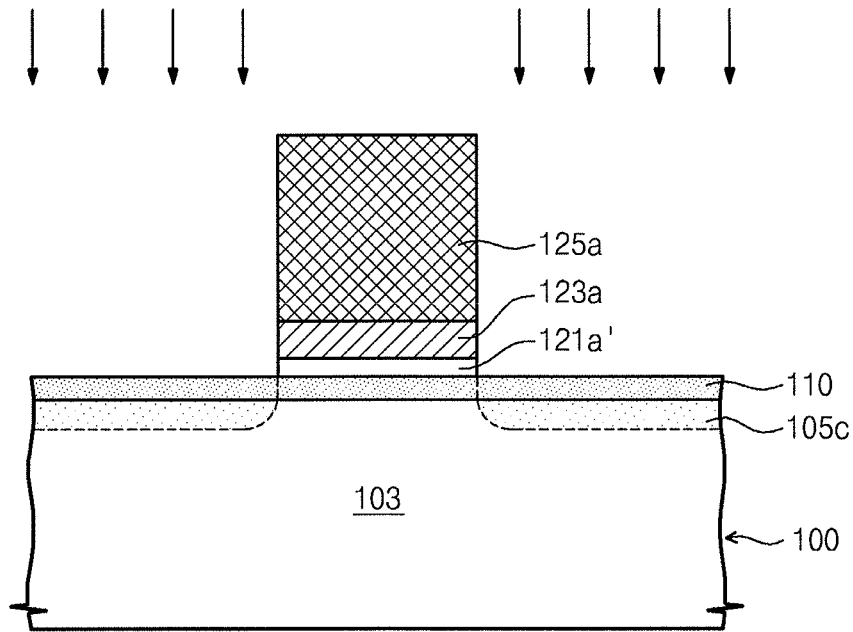

Referring to FIG. 13B, the dielectric pattern 121a', the first conductive pattern 123a, and the second conductive pattern 125a may be formed on the substrate 100. The pair of diffusion barrier element injection regions 105c may be formed by injecting diffusion barrier elements into an upper region of the active part 103 adjacent to both side walls of the dielectric pattern 121a' and an active part 103 that is exposed from the gate pattern 120. The diffusion barrier element may be impurities different from the first and second conductive dopants. The second conductive dopant may have a type opposite to that of the first conductive dopant. According to an embodiment of the inventive concept, the diffusion barrier element may be halogen, e.g., fluorine.

Figure 13C:
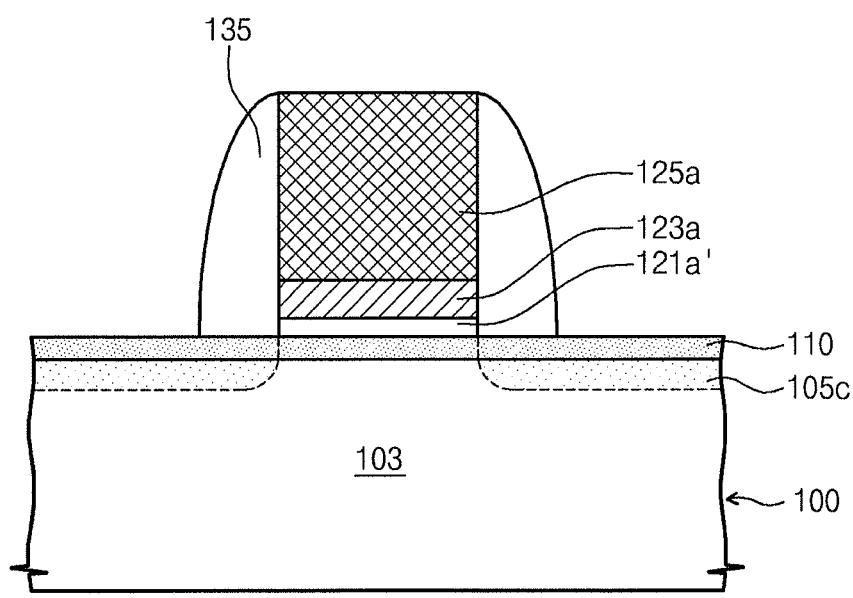

Referring to FIG. 13C, doping regions 107 may be formed in active part 103 adjacent to both side walls of the dielectric pattern 121a'. Also, the spacers 135 covering both side walls of the dielectric pattern 121a', first conductive pattern 123a and second conductive pattern 125a may be formed.

According to an embodiment of the inventive concept, the diffusion barrier element injection regions 105c may overlap with doping regions 107. The diffusion barrier elements may decrease the diffusion distances of the second conductive dopants that are doped on the doping regions 107. Accordingly, the depths of the doping regions 107 can decrease, and thus the short channel effect of the semiconductor device according to embodiments of the inventive concept may be minimized.

Figure 13D:
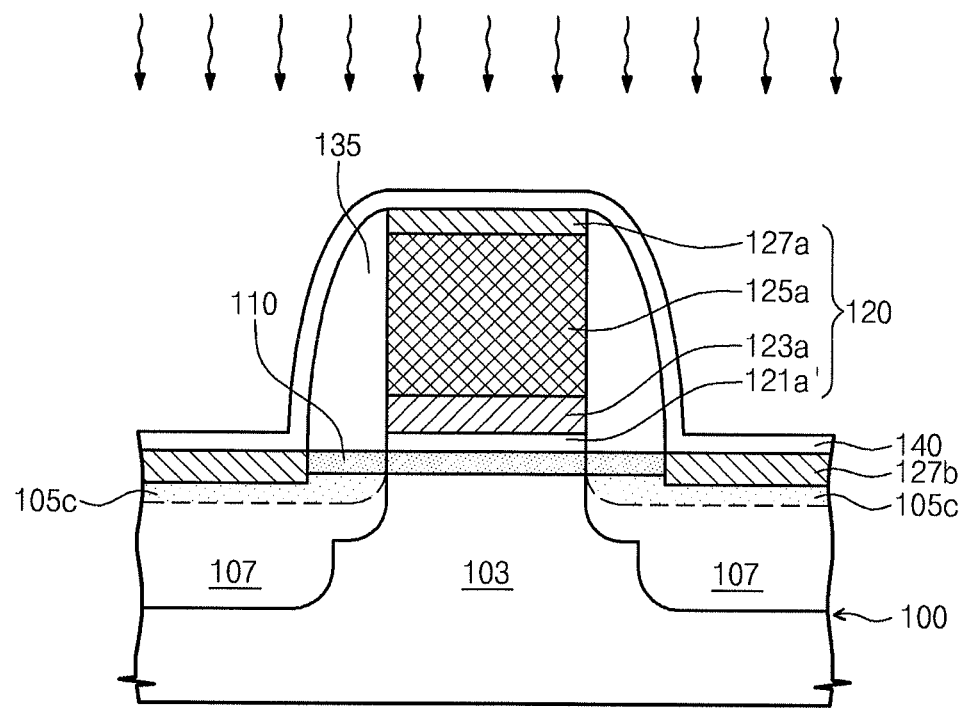

Referring to FIG. 13D, the metal layer 140 may be formed on the substrate 100, and the first and second metal-semiconductor compound patterns 127a and 127b may be formed by performing a thermal treatment process on the substrate 100 where the metal layer 140 is formed. The metal layer 140 may be formed in the same shape and structure, as well as same process, as those described above with reference to FIG. 3E in the first embodiment of the inventive concept.

The first and second metal-semiconductor compound patterns 127a and 127b may be formed in the same shapes as the shapes and structures, as well as same processes, as those described above with reference to FIG. 9D in the fourth embodiment of the inventive concept. The dielectric pattern 121a', the first conductive pattern 123a, the second conductive pattern 125a, and the first metal-semiconductor compound pattern 127a may be included in a gate pattern 120. After forming the first and second metal-semiconductor compound patterns 127a and 127b, the metal layer 140 may be removed, e.g., by a wet etching process.

According to the sixth embodiments of the inventive concept, the pair of diffusion barrier element injection regions 105c may be disposed in the upper region of the active part 103 adjacent to both side walls of the gate pattern 120. The diffusion barrier elements included in the diffusion barrier element injection regions 105c may decrease the diffusion distances of the second conductive dopants included in the doping regions 107. Accordingly, the depths of the doping regions 107 can decrease, and thus, the short channel effect of the semiconductor device according to embodiments of the inventive concept may be minimized. As a result, electric characteristic of the semiconductor device can improve.

Figure 14:
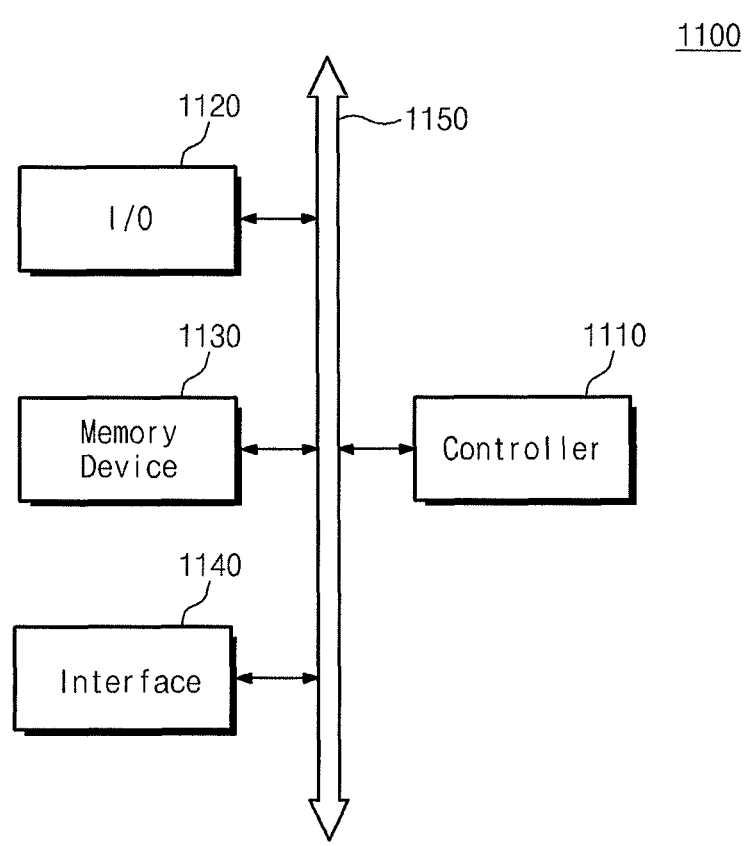
FIG. 14 illustrates a schematic block diagram of a memory system including a semiconductor device according to embodiments of the inventive concept.

FIG. 14 is a block diagram schematically illustrating an example of a memory system which includes a semiconductor device according to embodiments of the inventive concept.

Referring to FIG. 14, an electronic system 1100 including a semiconductor device according to embodiments of the inventive concept may include a controller 1110, an input/output (I/O) device 1120, a memory device 1130, an interface 1140, and a bus 1150. The controller 1110, the I/O device 1120, the memory device 1130, and the interface 1140 may be connected through the bus 1150. The bus 1150 corresponds to a path through which data is transferred.

The controller 1110 may include at least one of a microprocessor, a digital signal processor, a microcontroller, and logic devices having functions similar thereto. The I/O device 1120 may include a keypad, a keyboard, and/or a display device. The memory device 1130 may store data and/or commands. The memory device 130 may include at least one of the above-described semiconductor devices according to embodiments of the inventive concept. The memory device 1130 may further include another type of semiconductor device (for example, a nonvolatile memory device and/or a Static Random Access Memory (SRAM)). The interface 1140 may transmit data to a communication network or receive data from the communication network. The interface 1140 may be a wired type or a wireless type. For example, the interface 1140 may include an antenna or a wired/wireless transceiver. Although not shown, the electronic system 1110 is a working memory device for enhancing the operation of the controller 1110, and may further include a high-speed SRAM device.

The electronic system 1100 may be applied to Personal Digital Assistants (PDAs), portable computers, web tablets, wireless phones, mobile phones, digital music players, memory cards, and all kinds of electronic devices that may transmit/receive information at a wireless environment.

Figure 15:
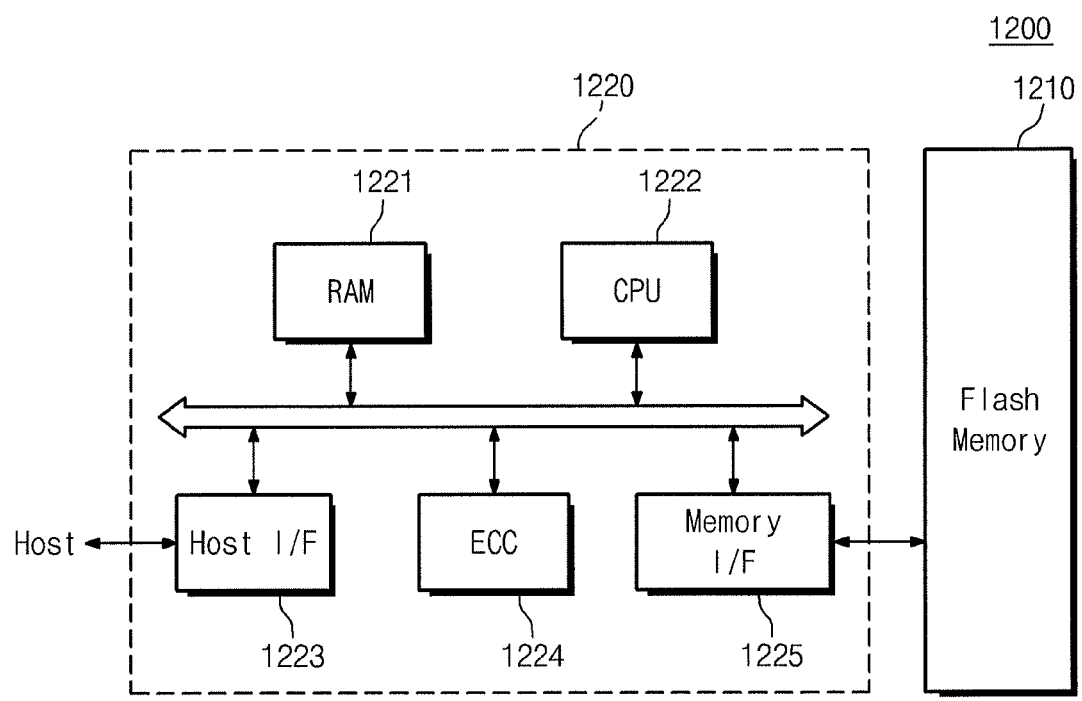
FIG. 15 illustrates a schematic block diagram of a memory card including a semiconductor device according to embodiments of the inventive concept.

FIG. 15 is a block diagram schematically illustrating an example of a memory card which includes a semiconductor device according to embodiments of the inventive concept.

Referring to FIG. 15, an electronic system 1200 including a memory card according to embodiments of the inventive concept may include a memory device 1210. The memory device 1210 may further include at least one of the above-described semiconductor devices according to embodiments of the inventive concept. Also, the memory device 1210 may further include another type of semiconductor device (for example, a nonvolatile memory device and/or a Static Random Access Memory (SRAM)). The other type of semiconductor device may be a semiconductor device according to embodiments of the inventive concept. The memory card 1200 may include a memory controller 1220 that controls data exchange between a host and the memory device 1210.

The memory controller 1220 may include a processing unit 1222 that controls the overall operation of the memory card 1200. Also, the memory controller 1220 is a working memory of the processing unit 1222, and may include a SRAM 1221. The SRAM 1221 may also be a memory according to embodiments of the inventive concept. Besides, the memory controller 1220 may further include a host interface 1223 and a memory interface 1225. The host interface 1223 may include a protocol for data exchange between the memory card 1200 and the host. The memory interface 1225 may connect the memory controller 1220 and the memory device 1210. Furthermore, the memory controller 1220 may further include an Error Correction Code (ECC) block 1224. The ECC block 1224 may detect and correct an error of data that is read from the memory device 1210. Although not shown, the memory card 1200 may further include a Read-Only Memory (ROM) that stores code data for interfacing with the host. The memory card 1200 may be used as a portable data storage card. To the contrary, the memory card 1200 may be implemented with a Solid State Disk (SSD) that may replace a hard disk of a computer system.

In the above-described embodiments of the inventive concept, the semiconductor devices may be implemented as various types of semiconductor packages. For example, the semiconductor devices according to embodiments of the inventive concept may be packaged in types such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP), and Wafer-Level Processed Stack Package (WSP). A package, on which the semiconductor device according to embodiments of the inventive concept is mounted, may further include a controller and/or a logic device for controlling the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   an isolation pattern disposed on a substrate, the isolation pattern defining an active part;
   a gate pattern crossing the active part on the substrate, the gate pattern including a dielectric pattern and a first conductive pattern, the dielectric pattern being between the active part and the first conductive pattern;
   a pair of doping regions in the active part adjacent sidewalls of the gate pattern, the gate pattern being between the pair of doping regions; and
   a diffusion barrier element injection region disposed in an upper region of the active part, wherein an upper surface of the diffusion barrier element injection region contacts a lower surface of the dielectric pattern.

2. The semiconductor device as claimed in claim 1, wherein:
   the active part includes a first conductive dopant,
   the doping regions include a second conductive dopant, and
   the diffusion barrier element injection region includes a diffusion barrier element, the diffusion barrier element being configured to decrease diffusion distances of at least one of the first and second conductive dopants.

3. The semiconductor device as claimed in claim 2, wherein the diffusion barrier element is a halogen.

4. The semiconductor device as claimed in claim 1, wherein the diffusion barrier element injection region includes:
   first sub regions in upper regions of the doping regions; and
   a second sub region disposed in an upper region of the active part between the doping regions, the second sub region being between the first sub regions.

5. The semiconductor device as claimed in claim 4, wherein a concentration of a diffusion barrier element in each first sub region is substantially the same as a concentration of a diffusion barrier element in the second sub region.

6. The semiconductor device as claimed in claim 4, wherein a concentration of a diffusion barrier element in each first sub region is substantially lower than a concentration of a diffusion barrier element in the second sub region.

7. The semiconductor device as claimed in claim 1, wherein:
   the first conductive pattern of the gate pattern includes a conductive metal or a conductive metal nitride, an uppermost surface of the dielectric pattern being at a same level or lower than a lowermost surface of the first conductive pattern,
   the gate pattern further comprises:
   a second conductive pattern including a semiconductor material; and
   a first metal-semiconductor compound on the second conductive pattern, and
   the semiconductor device further comprises:
   a second metal-semiconductor compound disposed at an upper region of each of the doping regions, the first and second metal-semiconductor compounds including a same metal.

8. The semiconductor device as claimed in claim 1, wherein the diffusion barrier element injection region is only in an upper region of each of the doping regions.

9. The semiconductor device as claimed in claim 1, wherein a concentration of a diffusion barrier element in a portion of the diffusion barrier element injection region overlapping the doping regions is different from a concentration of a diffusion barrier element in a portion of the diffusion barrier element injection region overlapping a channel region below the gate pattern.

10. The semiconductor device as claimed in claim 9, wherein the concentration of the diffusion barrier element in a portion of the diffusion barrier element injection region overlapping the doping regions is lower than the concentration of the diffusion barrier element in a portion of the diffusion barrier element injection region overlapping the channel region.

11. A semiconductor device, comprising:
an isolation pattern disposed on a substrate, the isolation pattern defining an active part including a semiconductor material;
a gate pattern crossing the active part on the substrate;
spacers on respective sides of the gate pattern;
an epitaxial layer between the active part and the gate pattern, the epitaxial layer including a semiconductor material having an energy band gap smaller than the semiconductor material of the active part;
a pair of doping regions in the active part adjacent to side walls of the gate pattern, the gate pattern being between the pair of doping regions; and
a diffusion barrier element injection region disposed in an upper region of the active part, wherein the epitaxial layer has a width that is substantially coextensive with a distance between outer surfaces of the spacers.

12. The semiconductor device as claimed in claim 11, wherein the epitaxial layer extends laterally beyond the side walls of the gate pattern.

13. The semiconductor device as claimed in claim 11, wherein the diffusion barrier element injection region includes a diffusion barrier element, the diffusion barrier element being a halogen.

14. The semiconductor device as claimed in claim 11, wherein the epitaxial layer and the diffusion barrier element injection region include a same diffusion barrier element.

15. The semiconductor device as claimed in claim 11, wherein the diffusion barrier element injection region includes:
a pair of first sub regions disposed in the doping regions; and
a second sub region disposed in an upper region of the active part between the doping regions and having a width less than the width of the epitaxial layer, a concentration of a diffusion barrier element in each first sub region being lower than a concentration of a diffusion barrier element in the second sub region.

16. The semiconductor device as claimed in claim 11, wherein the gate pattern includes:
a first conductive pattern including a conductive metal or a conductive metal nitride, an entire top of the dielectric pattern overlapping the first conductive pattern; and
a second conductive pattern including a semiconductor material.

17. The semiconductor device as claimed in claim 11, wherein the diffusion barrier element injection region is provided as one pair, each of the diffusion barrier element injection regions being in an upper region of each of the doping regions.

18. A semiconductor device, comprising:
an active part on a substrate;
a gate pattern crossing the active part on the substrate, the gate pattern being between two doping regions;
an epitaxial layer between the active part and the gate pattern, the epitaxial layer having a smaller energy band gap than the active part; and
a diffusion barrier element injection region in an upper region of the active part, the diffusion barrier element injection region including first regions in the doping regions and a second region between the doping regions, and a concentration of a diffusion barrier element in each first region being lower than the concentration of a diffusion barrier element in the second region, wherein at least a portion of each first region has a first thickness and the second region has a second thickness greater than the first thickness.

19. The semiconductor device as claimed in claim 18, wherein:
each first region is in an upper part of a respective doping region, the first region extending from a respective side wall of the gate pattern to overlap the respective doping region, and
the second region is in the channel region of the gate pattern.

* * * * *